US010267973B2

(12) United States Patent
Saitoh et al.

(10) Patent No.: US 10,267,973 B2
(45) Date of Patent: Apr. 23, 2019

(54) WAVELENGTH CONVERSION MEMBER, BACKLIGHT UNIT, POLARIZING PLATE, LIQUID CRYSTAL PANEL, AND LIQUID CRYSTAL DISPLAY DEVICE

(71) Applicant: FUJIFILM Corporation, Tokyo (JP)

(72) Inventors: Yukito Saitoh, Kanagawa (JP); Yujiro Yanai, Kanagawa (JP); Naoyoshi Yamada, Kanagawa (JP); Takashi Yonemoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/363,109

(22) Filed: Nov. 29, 2016

(65) Prior Publication Data
US 2017/0075052 A1 Mar. 16, 2017

Related U.S. Application Data

(63) Continuation of application No. PCT/JP2015/065341, filed on May 28, 2015.

(30) Foreign Application Priority Data

May 30, 2014 (JP) .................. 2014-113381

(51) Int. Cl.
G02F 1/1335 (2006.01)
F21V 8/00 (2006.01)
H01L 33/50 (2010.01)

(52) U.S. Cl.
CPC ........... G02B 6/0026 (2013.01); G02B 6/005 (2013.01); G02F 1/133528 (2013.01);
(Continued)

(58) Field of Classification Search
CPC ... G02F 2001/133614; G02F 1/133617; H01L 33/504
See application file for complete search history.

(56) References Cited

U.S. PATENT DOCUMENTS

2007/0291196 A1* 12/2007 Wang .................. G02B 6/0056
349/62
2012/0248479 A1* 10/2012 Anc ...................... H01L 33/504
257/98
(Continued)

FOREIGN PATENT DOCUMENTS

JP H08-7614 A 1/1996
JP 2005-092023 A 4/2005
(Continued)

OTHER PUBLICATIONS

Notification of Reasons for Refusal issued by the Japanese Patent Office dated May 30, 2017, in connection with Japanese Patent Application No. 2014-113381.
(Continued)

Primary Examiner — Alexander P Gross
(74) Attorney, Agent, or Firm — Edwards Neils, LLC; Jean C. Edwards, Esq.

(57) ABSTRACT

Provided is a wavelength conversion member, including: a wavelength conversion layer containing a quantum dot which is excited by excitation light and emits fluorescent light; and an adjacent layer directly laminated on the wavelength conversion layer, in which the shape of an interface between the wavelength conversion layer and the adjacent layer includes an irregular shape formed of a concave portion and a convex portion. Provided are a backlight unit, a polarizing plate, a liquid crystal panel, and a liquid crystal display device: including the wavelength conversion member.

11 Claims, 8 Drawing Sheets

(52) U.S. Cl.
CPC .. *H01L 33/50* (2013.01); *G02F 2001/133614* (2013.01); *G02F 2202/36* (2013.01)

(56) References Cited

U.S. PATENT DOCUMENTS

| | | | |
|---|---|---|---|
| 2014/0036536 A1* | 2/2014 | Gettemy | G02B 26/02 362/612 |
| 2015/0123158 A1* | 5/2015 | Sung | H01L 33/46 257/98 |

FOREIGN PATENT DOCUMENTS

| | | | |
|---|---|---|---|
| JP | 2007-109947 A | | 4/2007 |
| JP | 2013-544018 A | | 12/2013 |
| JP | 2014-082416 A | | 5/2014 |
| JP | 2014082416 A | * | 5/2014 |
| WO | 2012/064562 A1 | | 5/2012 |

OTHER PUBLICATIONS

International Search Report issued in connection with International Patent Application No. PCT/JP2015/065341 dated Jul. 21, 2015.
Written Opinion issued in connection with International Patent Application No. PCT/JP2015/065341 dated Jul. 21, 2015.
International Preliminary Report on Patentability issued by WIPO dated Dec. 15, 2016, in connection with International Patent Application No. PCT/JP2015/065341.

\* cited by examiner

WAVELENGTH CONVERSION MEMBER, BACKLIGHT UNIT, POLARIZING PLATE, LIQUID CRYSTAL PANEL, AND LIQUID CRYSTAL DISPLAY DEVICE

CROSS-REFERENCE TO RELATED APPLICATIONS

This application is a Continuation of PCT International Application No. PCT/JP2015/065341 filed on May 28, 2015, which was published under PCT Article 21(2) in Japanese and which claims priority under 35 U.S.C. § 119(a) to Japanese Patent Application No. 2014-113381 filed on May 30, 2014. The above applications are hereby expressly incorporated by reference, in their entirety, into the present application.

BACKGROUND OF THE INVENTION

1. Field of the Invention

The present invention relates to a wavelength conversion member which includes a wavelength conversion layer containing quantum dot, and a backlight unit, a polarizing plate, a liquid crystal panel, and a liquid crystal display device, which include the wavelength conversion member.

2. Description of the Related Art

A flat panel display such as a liquid crystal display device (hereinafter, also referred to as LCD) has been annually widely used as a space saving image display device having low power consumption. The liquid crystal display device is configured of at least a backlight unit and a liquid crystal cell, and in general, further includes a member such as a backlight side polarizer and a visible side polarizer.

In the flat panel display market, improvement in color reproducibility has progressed as improvement in LCD performance. Regarding this viewpoint, recently, a quantum dot (also referred to as QD) has received attention as a light emitting material (refer to JP2013-544018A). For example, in a case where excitation light is incident on a wavelength conversion member containing a quantum dot from a light source of a backlight unit, the quantum dot is excited, and thus, fluorescent light having a wavelength different from that of the excitation light is emitted (wavelength conversion). Here, by using a quantum dot having different light emitting properties, white light is able to be realized in which red light, green light, and blue light exit form a wavelength conversion member. The fluorescent light of the quantum dot has a small half-width, and thus, white light to be obtained has high brightness and excellent color reproducibility. A color reproduction range increases from 72% to 100% of the current TV standard (full high definition (FHD)), national television system committee (NTSC)) ratio according to progress in a three-wavelength light source technology using such a quantum dot.

SUMMARY OF THE INVENTION

As described above, a wavelength conversion member containing a quantum dot is a useful member in which LCD performance is able to be improved according to realization of white light having high brightness and improvement in color reproducibility. Then, in order to further increase such usefulness, it is desirable that light having higher intensity exits to a display surface side (hereinafter, also referred to as a "display side") of LCD from the wavelength conversion member. As light having higher intensity exits to the display side from the wavelength conversion member, it is possible to improve front brightness on the display surface of LCD in which the wavelength conversion member is incorporated. Accordingly, a more bright and brilliant image is able to be provided to an LCD viewer from a front direction.

Therefore, an object of the present invention is to provide a wavelength conversion member containing a quantum dot, in which light having high intensity is able to exit to a display surface side of a liquid crystal display device.

In order to attain the object described above, the present inventors have conducted intensive studies. As a result thereof, it has been newly found that the object described above is able to be attained by a wavelength conversion member described below, comprising: a wavelength conversion layer containing a quantum dot which is excited by excitation light and emits fluorescent light; and an adjacent layer directly laminated on the wavelength conversion layer, in which the shape of an interface between the wavelength conversion layer and the adjacent layer includes an irregular shape formed of a concave portion and a convex portion. That is, as a result of intensive studies of the present inventors, it has been newly found that light having high intensity is able to exit to a display side according to such a wavelength conversion member.

The followings are presumptions of the present inventors and do not limit the present invention, and the present inventors have considered that including the irregular shape in the shape of the interface between the two layers contributes to improvement in a light emitting efficiency of the quantum dot and improvement in an exiting efficiency of light from the wavelength conversion member. The more details are as described below. Furthermore, the exiting efficiency is used as the meaning including both of an extraction efficiency in which the fluorescent light (internal light emission) emitted from the quantum dot in the wavelength conversion layer is extracted from the wavelength conversion member to the display side and an efficiency in which the excitation light incident on the wavelength conversion member from a light source of a backlight unit exits to the display side.

A wavelength conversion member including a wavelength conversion layer containing a quantum dot which is excited by blue light and emits red light and a quantum dot which is excited by blue light and emits green light is described as an example. Furthermore, in the present invention, the excitation light is not limited to the blue light, and the quantum dot contained in the wavelength conversion layer is not also limited thereto. The details will be described below.

In the wavelength conversion layer described above, it is possible to increase the amount of red light and green light emitted from the quantum dot as a probability of the blue light incident on the quantum dot increases. That is, it is possible to improve a light emitting efficiency of the quantum dot. Regarding this viewpoint, it is considered that the irregular shape of the interface performs an action in which the blue light incident on the wavelength conversion member from the light source of the backlight unit is reflected, preferably, retroreflected on the backlight unit side (hereinafter, also referred to as a "backlight side"), and returns to the backlight side. The light returning to the backlight side is able to be reflected by a member (a reflection plate or the like) having reflectivity included in the backlight unit, and is able to be incident again on the wavelength conversion member. Thus, the present inventors have considered that enabling the probability of the blue light incident on the quantum dot to increase by increasing the amount of blue light incident on the wavelength conversion member contributes to improvement in the light emitting efficiency of the quantum dot.

In addition, it is considered that the irregular shape of the interface also performs an action in which light transmitted through the interface is condensed towards the display side. Accordingly, it is considered that enabling blue light transmitted through the interface to be condensed on the display side contributes to an increase in the amount of blue light exiting to the display side. Further, in an aspect in which a layer on an excitation light incidence side in two layers is the wavelength conversion layer containing a quantum dot, it is considered that light condensing is able to be performed by the irregular shape when the light emitted from the quantum dot is also transmitted through the interface, and thus, it is possible to increase the amount of fluorescent light which is emitted by the quantum dot and exits to the display side.

As described above, the present inventors have assumed that it is possible to increase the amount of blue light, red light, and green light exiting from the wavelength conversion member to the display side.

In the present invention, the two layers described above which are laminated through the interface having an irregular shape are directly laminated. Here, being directly laminated indicates that two layers are directly in contact with each other not through other layers. The details of the irregular shape included in the shape of the interface will be described below.

In one aspect, one of the wavelength conversion layer and the adjacent layer is a layer of high refractive index, and the other is a layer of low refractive index having an average refractive index lower than that of the layer of high refractive index.

In one aspect, in the two layers described above, the layer of high refractive index is a layer positioned on an excitation light incidence side from the layer of low refractive index. Light from the light source of the backlight unit incident on the wavelength conversion member at the time of being used, and at least a part of the quantum dot contained in the wavelength conversion layer is excited by the light, and thus, the fluorescent light is emitted. In one aspect, in the two layers described above, the layer of high refractive index is included as a layer on a side on which such excitation light is incident (an excitation light incidence side), and the layer of low refractive index is included as a layer on a side to which the fluorescent light emitted from the quantum dot or the excitation light exits (an exiting side). Thus, the layer of high refractive index and the layer of low refractive index are arranged, and thus, it is considered that when light is incident on the layer of low refractive index from the layer of high refractive index, it is possible to further increase the amount of light exiting to the display side from the wavelength conversion member by condensing the light.

In one aspect, the layer of high refractive index is the wavelength conversion layer.

In one aspect, the layer of low refractive index is the wavelength conversion layer.

In one aspect, the average refractive index of the layer of low refractive index is greater than or equal to 1.00 and less than 1.60.

In one aspect, the average refractive index of the layer of high refractive index is from 1.60 to 2.50.

In one aspect, a difference in the average refractive indices between the layer of high refractive index and the layer of low refractive index is from 0.20 to 0.70.

In one aspect, the adjacent layer described above is also a wavelength conversion layer containing a quantum dot which is excited by excitation light and emits fluorescent light, and a light emission center wavelength of the quantum dot is different from a light emission center wavelength of the quantum dot contained in the wavelength conversion layer.

In one aspect, the irregular shape is formed by one-dimensionally or two-dimensionally arranging shapes selected from the group consisting of a polygonal pyramidal shape, a conical shape, a partially rotating ellipsoidal shape, and a partially spherical shape on the interface between the two layers.

Here, being one-dimensionally arranged indicates that the shapes described above are arranged only in one direction of the interface, that is, arranged in parallel. On the other hand, being two-dimensionally arranged indicates that the shapes described above are arranged in two or more directions of the interface. For example, being two-dimensionally arranged is not limited to an aspect in which the shape is formed in two directions of one direction and a direction orthogonal to the one direction or is regularly formed, but also includes an aspect in which the shape is irregularly (randomly) formed.

Furthermore, in the present invention and herein, the description relevant to an angle such as being orthogonal or parallel includes an error range which is allowable in the technology field to which the present invention belongs. For example, the angle indicates a range of less than an exact angle ±10°, and an error with respect to the exact angle is preferably less than or equal to 5°, and is more preferably less than or equal to 3°.

In one aspect, in the irregular shape, a sectional shape of the convex portion is a triangular shape.

Another aspect of the present invention relates to a backlight unit, comprising: the wavelength conversion member described above; and a light source.

Still another aspect of the present invention relates to a liquid crystal, display device, comprising: the backlight unit described above; and a liquid crystal panel. Furthermore, the liquid crystal panel includes at least a liquid crystal cell, and in general, is a member including a visible side polarizer or a backlight side polarizer, and the details will be described below.

Yet another aspect of the present invention relates to a polarizing plate, comprising: the wavelength conversion member described above; and a polarizer.

Still yet another aspect of the present invention relates to a liquid crystal panel, comprising: the polarizing plate described above; and a liquid crystal cell.

Further yet another aspect of the present invention relates to a liquid crystal display device, comprising: the liquid crystal panel described above; and a backlight unit including a light source.

According to the present invention, in a liquid crystal display device provided with a wavelength conversion member including a wavelength conversion layer containing a quantum dot, it is possible to attain improvement in front brightness.

DESCRIPTION OF THE PREFERRED EMBODIMENTS

Figure 1A:
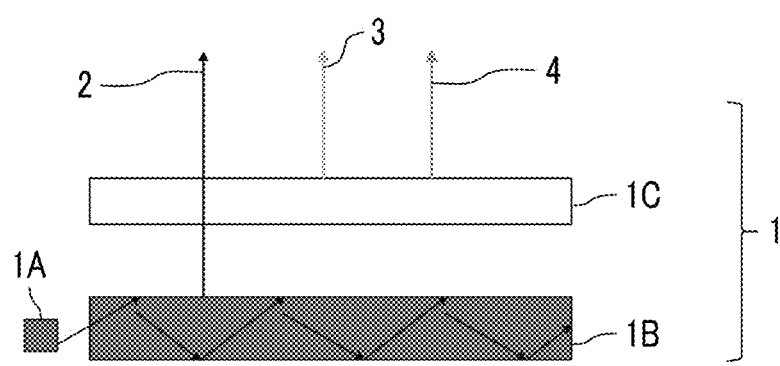
FIGS. 1A and 1B are explanatory diagrams of one example of a backlight unit including a wavelength conversion member according to one aspect of the present invention.

The following description is based on representative embodiments of the present invention, but the present invention is not limited to such embodiments. Furthermore, in the present invention and herein, a numerical range denoted by using "to" indicates a range including numerical values before and after "to" as the lower limit value and the upper limit value.

In addition, in the present invention and herein, a "half-width" of a peak indicates the width of a peak at a height of ½ of a peak height. In addition, light having a light emission center wavelength in a wavelength range of 400 to 500 nm, and preferably a wavelength range of 430 to 480 nm will be referred to as blue light, light having a light emission center wavelength in a wavelength range of 500 to 600 nm will be referred to as green light, and light having a light emission center wavelength in a wavelength range of 600 to 680 nm will be referred to as red light.

[Wavelength Conversion Member]

A wavelength conversion member according to one aspect of the present invention is a wavelength conversion member including a wavelength conversion layer containing a quantum dot which is excited by excitation light and emits fluorescent light, and an adjacent layer directly laminated on the wavelength conversion layer, in which the shape of an interface between the wavelength conversion layer and the adjacent layer includes an irregular shape formed of a concave portion and a convex portion.

Hereinafter, the wavelength conversion member described above will be described in more detail.

<Wavelength Conversion Layer>

(Quantum Dot)

The wavelength conversion layer contains at least one type of quantum dot, and is also able to contain two or more types of quantum dots having different light emitting properties. A known quantum dot includes a quantum dot A having a light emission center wavelength in a wavelength range of 600 nm to 680 nm, a quantum dot B having a light emission center wavelength in a wavelength range of 500 nm to 600 nm, and a quantum dot C having a light emission center wavelength in a wavelength range of 400 nm to 500 nm. The quantum dot A is excited by excitation light and emits red light, the quantum dot B emits green light, and the quantum dot C emits blue light. For example, in a case where blue light is incident on a wavelength conversion layer containing the quantum dot A and the quantum dot B as the excitation light, white light is able to be realized by red light emitted by the quantum dot A, green light emitted by the quantum dot B, and blue light transmitted through the wavelength conversion layer. Alternatively, ultraviolet light is incident on a wavelength conversion layer containing the quantum dots A, B, and C as the excitation light, and thus, white light is able to be realized by red light emitted by the quantum dot A, green light emitted by the quantum dot B, and blue light emitted by the quantum dot C. Furthermore, the ultraviolet light indicates light having a wavelength of 280 to 400 nm, preferably, light having a wavelength of 280 to 380 nm.

A quantum dot prepared by a known method or a commercially available product is able to be used as the quantum dot without any limitation. The quantum dot, for example, can be referred to paragraphs 0060 to 0066 of JP2012-169271A, but is not limited thereto. A light emission wavelength of the quantum dot, in general, is able to be adjusted according to the composition of particles, the size of the particles, and the composition and the size of the particles.

Hereinafter, specific aspects of wavelength conversion in the wavelength conversion member including the wavelength conversion layer containing a quantum dot will be described with reference to the drawings. Here, the present invention is not limited to the specific aspects described below.

Figure 1B:
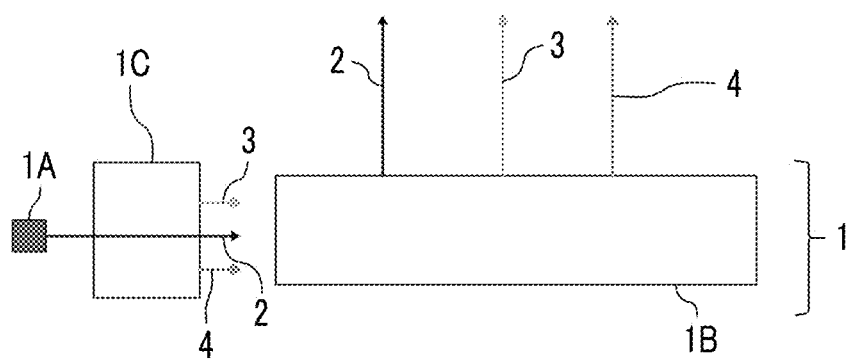

FIGS. 1A and 1B are explanatory diagrams of one example of a backlight unit 1 including a wavelength conversion member according to one aspect of the present invention. In FIGS. 1A and 1B, the backlight unit 1 includes a light source 1A, and a light guide plate 1B for being used as a plane light source. In the example illustrated in FIG. 1A, the wavelength conversion member is disposed on a path of light exiting from the light guide plate. On the other hand, in the example illustrated in FIG. 1B, the wavelength conversion member is disposed between the light guide plate and the light source.

Then, in the example illustrated in FIG. 1A, light exiting from the light guide plate 1B is incident on a wavelength conversion member 1C. In the example illustrated in FIG. 1A, light 2 exiting from the light source 1A disposed on an edge portion of the light guide plate 1B is blue light, and exits towards a liquid crystal cell (not illustrated) from the surface of the light guide plate 1B on the liquid crystal cell side. The wavelength conversion member 1C disposed on a path of the light (the blue light 2) exiting from the light guide plate 1B includes at least a quantum dot A which is excited by the blue light 2 and emits red light 4, and a quantum dot B which is excited by the blue light 2 and emits green light 3. Thus, the excited green light 3 and red light 4, and the blue light 2 transmitted through the wavelength conversion member 1C exit from the backlight unit 1. Thus, the red light, the green light, and the blue light are emitted, and thus, white light is able to be realized.

The example illustrated in FIG. 1B is identical to the aspect illustrated in FIG. 1A except that the arrangement of the wavelength conversion member and the light guide plate is different. In the example illustrated in FIG. 1B, the excited green light 3 and red light 4, and the blue light 2 transmitted through the wavelength conversion member 1C exit from the wavelength conversion member 1C and are incident on the light guide plate, and thus, a plane light source is realized.

In the wavelength conversion layer, the quantum dot described above, in general, is contained in a matrix. The matrix, in general, is a polymer (an organic matrix) in which a polymerizable composition is polymerized by light irradiation or the like. The shape of the wavelength conversion layer is not particularly limited. For example, the wavelength conversion layer and the wavelength conversion member including the wavelength conversion layer are in the shape of a sheet or a film.

The wavelength conversion layer is preferably prepared by a coating method. Specifically, a polymerizable composition containing a quantum dot (a curable composition) is applied onto a suitable support, and then, a curing treatment is performed by light irradiation or the like, and thus, a wavelength conversion layer is able to be obtained.

The polymerizable compound used in the preparation of the polymerizable composition is not particularly limited. It is preferable that the content of the total polymerizable compound with respect to the total amount of the polymerizable composition is approximately 10 to 99.99 mass %.

A (meth)acrylate compound such as a monofunctional or polyfunctional (meth)acrylate monomer, a polymer and a prepolymer thereof, and the like are preferable from the viewpoint of transparency, adhesiveness, and the like of a cured film after being cured. Furthermore, in the present invention and herein, the "(meth)acrylate" is used as the meaning of at least one of acrylate or methacrylate, or any one of acrylate and methacrylate. The same applies to "(meth)acryloyl" and the like.

Examples of the monofunctional (meth)acrylate monomer are able to include an acrylic acid and a methacrylic acid, a derivative thereof, and more specifically, a monomer having one polymerizable unsaturated bond of a (meth)acrylic acid (a (meth)acryloyl group) in the molecules. Such specific examples can be referred to paragraph 0022 of WO2012/077807A1.

A polyfunctional (meth)acrylate monomer having two or more (meth)acryloyl groups in the molecules is able to be used along with the monomer having one polymerizable unsaturated bond of the (meth)acrylic acid (the (meth)acryloyl group) in one molecule described above. The details thereof can be referred to paragraph 0024 of WO2012/077807A1. In addition, a polyfunctional (meth)acrylate compound disclosed in paragraphs 0023 to 0036 of JP2013-043382A is able to be used as the polyfunctional (meth)acrylate compound. Further, alkyl chain-containing (meth)acrylate monomers denoted by General Formulas (4) to (6) disclosed in paragraphs 0014 to 0017 in the specification of JP5129458B are also able to be used.

It is preferable that the use amount of the polyfunctional (meth)acrylate monomer is greater than or equal to 5 parts by mass with respect to 100 parts by mass of the total amount of the polymerizable compound contained in the polymerizable composition from the viewpoint of the strength of the coated film, and it is preferable that the use amount of the polyfunctional (meth)acrylate monomer is less than or equal to 95 parts by mass with respect to 100 parts by mass of the total amount of the polymerizable compound contained in the polymerizable composition from the viewpoint of suppressing gelation of the composition. In addition, from the same viewpoint, it is preferable that the use amount of the monofunctional (meth)acrylate monomer is from 5 parts by mass to 95 parts by mass with respect to 100 parts by mass of the total amount of the polymerizable compound contained in the polymerizable composition.

Examples of a preferred polymerizable compound are able to include a compound having an epoxy group and a compound having a cyclic group such as a ring-opening polymerizable cyclic ether group, for example, an oxetanyl group. Examples of such a compound are able to more preferably include a compound having an epoxy group (an epoxy compound). The epoxy compound can be referred to paragraphs 0029 to 0033 of JP2011-159924A.

The polymerizable composition described above is able to contain a known radical polymerization initiator or a cationic polymerization initiator as a polymerization initiator. The polymerization initiator, for example, can be referred to paragraph 0037 of JP2013-043382A and paragraphs 0040 to 0042 of JP2011-159924A. The content of the polymerization initiator with respect to the total amount of the polymerizable compound contained in the polymerizable composition is preferably greater than or equal to 0.1 mol %, and is more preferably 0.5 to 5 mol %.

The quantum dot may be added to the polymerizable composition described above in a state of particles, or may be added in a state of a dispersion liquid in which the quantum dots are dispersed in a solvent. It is preferable that the quantum dot is added in the state of the dispersion liquid from the viewpoint of suppressing aggregation of the particles of the quantum dot. Here, the solvent to be used is not particularly limited. The quantum dot is able to be added, for example, in the amount of approximately 0.1 to 10 parts by mass with respect to 100 parts by mass of the total amount of the polymerizable composition used for forming the wavelength conversion layer.

A formation method of the wavelength conversion layer is not particularly limited insofar as the wavelength conversion layer is a layer containing the components described above, and arbitrarily addible known additives. A composition prepared by simultaneously or sequentially mixing the components described above and one or more types of known additives added as necessary is applied onto a suitable substrate, and then, is polymerized and cured by being subjected to a polymerization treatment such as light irradiation and heating, and thus, a wavelength conversion layer containing a quantum dot in a matrix is able to be formed. Here, one example of the known additives is able to include a silane coupling agent which is able to improve adhesiveness with respect to the adjacent layer. A known silane coupling agent is able to be used as the silane coupling agent without any limitation. Examples of the silane coupling agent preferable from the viewpoint of adhesiveness are able to include a silane coupling agent denoted by General Formula (1) disclosed in JP2013-43382A. The details thereof can be referred to the description in paragraphs 0011 to 0016 of JP2013-43382A. The use amount of the additives such as the silane coupling agent is not particularly limited, and is able to be suitably set. In addition, a solvent may be added as necessary for the viscosity of the composition, and the like. In this case, the type and the added amount of the solvent to be used are not particularly limited. For example, one type or two or more types of organic solvents are able to be used by being mixed as the solvent.

The polymerizable composition containing a quantum dot described above is applied onto a suitable support, and the solvent is removed by being dried, and after that, the polymerizable composition is polymerized and cured by light irradiation or the like, and thus, a quantum dot layer is able to be obtained. Examples of a coating method include a known coating method such as a curtain coating method, a dip coating method, a spin coating method, a printing coating method, a spray coating method, a slot coating method, a roll coating method, a slide coating method, a blade coating method, a gravure coating method, and a wire bar method. In addition, curing conditions are able to be suitably set according to the type of polymerizable compound to be used or the composition of the polymerizable composition.

The total thickness of two layers which are directly laminated is preferably in a range of 1 to 500 µm, and is more preferably in a range of 100 to 400 μm. In addition, both of the two layers which are directly laminated are able to be wavelength conversion layers containing a quantum dot. In addition, the wavelength conversion layer may contain quantum dots having two or more types of different light emitting properties (having different light emission center wavelengths) in the same layer. In the wavelength conversion layer and the adjacent layer directly laminated on the wavelength conversion layer, the thickness of one layer is preferably in a range of 1 to 300 μm, is more preferably in a range of 10 to 250 μm, and is even more preferably in a range of 30 to 150 μm. Furthermore, the wavelength conversion layer and the adjacent layer in the wavelength conversion member described above have an irregular shape on the interface with respect to a layer which is directly laminated, and thus, the thickness is different according to the position. The thickness described above indicates the thickness of the thickest portion in a thickness direction.

In an aspect in which both of the two layers which are directly laminated are the wavelength conversion layers containing a quantum dot, quantum dots having different light emitting properties (light emission center wavelengths) are able to be used as the quantum dot contained in each layer. In this case, it is preferable that a wavelength conversion layer containing a quantum dot having a light emission center wavelength on a long wavelength side is disposed on an excitation light incidence side, and a wavelength conversion layer containing a quantum dot having a light emission center wavelength on a short wavelength side is disposed on an exiting light exiting side. This considers absorption properties unique to a quantum dot, in which a light absorption spectrum is wider than a light emitting spectrum on a short wavelength side. The more details are as described below.

For example, a quantum dot emitting red light as the fluorescent light is able to be excited by excitation light which exits from the light source of the backlight unit and is incident on the wavelength conversion layer, and is able to emit red light as the fluorescent light, and fluorescent light emitted from a quantum dot having a light emission center wavelength in a wavelength range shorter than that of the quantum dot described above, for example, a quantum dot emitting green light as the fluorescent light is also able to emit fluorescent light as the excitation light. In the two layers which are directly laminated, in a case where a wavelength conversion layer containing a quantum dot emitting green light is disposed on the excitation light incidence side, a phenomenon is able to occur in which green light exiting from the wavelength conversion layer is incident on a wavelength conversion layer containing a quantum dot emitting red light before being extracted from the wavelength conversion member, and thus, a part of the green light is consumed as excitation light for emitting red light. Accordingly, a light emitting efficiency of the red light is improved, but a light emitting efficiency of the green light decreases as being consumed as the excitation light. Therefore, as described above, it is preferable that the wavelength conversion layer containing a quantum dot having a light emission center wavelength on the long wavelength side (for example, a quantum dot emitting red light) is disposed on the excitation light incidence side, and the wavelength conversion layer containing a quantum dot having a light emission center wavelength on the short wavelength side (for example, a quantum dot emitting green light) is disposed on the exiting light exiting side from the viewpoint of a light emitting balance between the red light and the green light.

<Shape of Interface Between Directly Laminated Two Layers>

The wavelength conversion member described above includes the wavelength conversion layer described above as at least one layer of the two layers which are directly laminated. Then, the interface between the two layers has an irregular shape formed of a concave portion and a convex portion. The presumptions of the present inventors relevant to having the irregular shape are as described above. In one preferred aspect, the irregular shape described above is a shape in which a distance between bottom portions of two adjacent concave portions through a convex portion is in a range of 1 to 200 μm, and an inner angle on the apex of a triangular convex portion formed by connecting the apex of the convex portion and the bottom portion of the two adjacent concave portions through the convex portion is in a range of 50° to 100°. It is more preferable that the distance between the bottom portions of the two adjacent concave portions through the convex portion is in a range of 5 to 100 μm, and the inner angle on the apex of the triangular convex portion formed by connecting the apex of the convex portion and the bottom portion of the two adjacent concave portions through the convex portion is in a range of 60° to 90°, from the viewpoint of further improving the light emitting efficiency of the quantum dot and an exiting efficiency from the wavelength conversion member. Here, when in the two layers which are directly laminated, a layer side which is disposed on the backlight unit side (the excitation light incidence side) is considered as a lower portion at the time of using the wavelength conversion member, and a layer side disposed on the display side (the exiting side) is considered as an upper portion, the convex portion and the concave portion indicate portions observed as a convex portion and a concave portion.

Hereinafter, the irregular shape will be described in more detail with reference to the drawings.

Figure 2A:
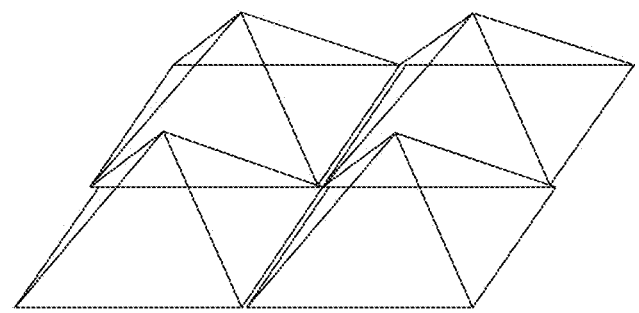
FIGS. 2A and 2B are schematic views illustrating one example of an irregular shape formed on an interface between two layers which are directly laminated in the wavelength conversion member according to one aspect of the present invention.
Figure 2B:
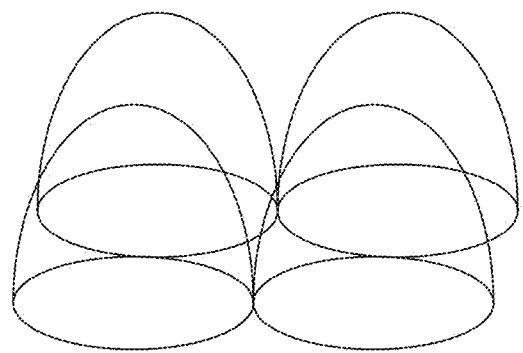

The irregular shape is preferably formed of a plurality of concave portions and a plurality of convex portions. In one aspect, the irregular shape formed as described above is formed of shapes two-dimensionally arranged on the interface between the two layers which are directly laminated. FIGS. 2A and 2B are schematic views of the irregular shape formed of the shapes which are two-dimensionally arranged. Furthermore, the number of shapes in the drawings is 4, but this is merely an example, and the present invention is not limited to the aspects illustrated in the drawings. The same applies to the other drawings.

FIG. 2A illustrates an irregular shape formed by two-dimensionally arranging a plurality of tetragonal pyramidal shapes. FIG. 2B illustrates an irregular shape formed by arranging a plurality of partially rotating ellipsoidal shapes. Specific examples of the shapes which are two-dimensionally arranged include a polygonal pyramidal shape, a conical shape, a partially circular shape, and the like other than the tetragonal pyramidal shape. Furthermore, the partially rotating ellipsoidal shape indicates a shape in which a part of a rotating ellipsoid is cut, and as illustrated in FIG. 2B, examples of the partially rotating ellipsoidal shape are able to include a half-rotating ellipsoidal shape in which a rotating ellipsoid is cut in half in a short axis direction. The same applies to a partially spherical shape.

Figure 3A:
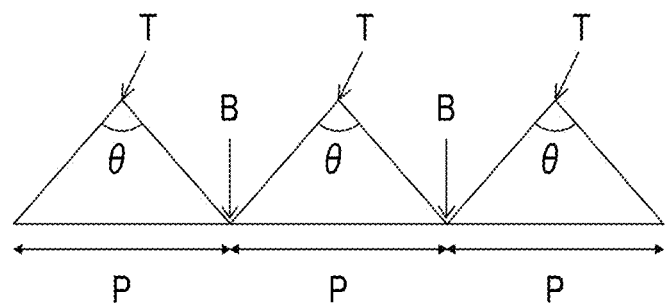
FIGS. 3A to 3C are explanatory diagrams of the irregular shape.
Figure 3B:
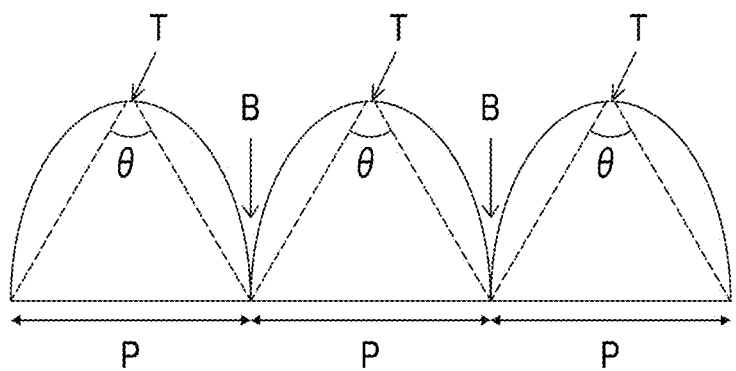
Figure 3C:
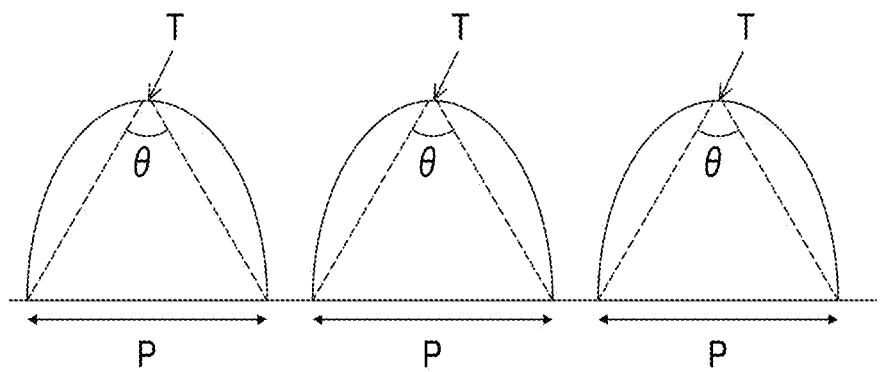

Explanatory diagrams are FIGS. 3A to 3C in which "the distance between the bottom portions of the two adjacent concave portions through the convex portion" and "the inner angle on the apex of the triangular convex portion formed by connecting the apex of the convex portion and the bottom portion of the two adjacent concave portions through the convex portion" are described by using the shapes illustrated in FIGS. 2A and 2B as an example. Furthermore, as illustrated in FIGS. 3A to 3C, "the distance between the bottom portions of the two adjacent concave portions through the convex portion" and "the inner angle on the apex of the triangular convex portion formed by connecting the apex of the convex portion and the bottom portion of the two adjacent concave portions through the convex portion" are determined on a sectional surface including a perpendicular line passing through the apex of the convex portion.

FIG. 3A is a partial sectional view of the irregular shape formed by arranging the plurality of tetragonal pyramidal shapes illustrated in FIG. 2A, "The distance between the bottom portions of the two adjacent concave portions through the convex portion" indicates a distance P between the bottom portions of the concave portions illustrated by a reference mark B in FIG. 3A. In addition, "the inner angle on the apex of the triangular convex portion formed by connecting the apex of the convex portion and the bottom portion of the two adjacent concave portions through the convex portion" indicates an inner angle θ on an apex T of a triangular convex portion formed by connecting the apex of the convex portion illustrated by a reference mark T in FIG. 3A and the bottom portion B of the two concave portions.

In addition, FIG. 3B is a partial sectional view of the irregular shape formed by arranging the plurality of half-rotating ellipsoidal shapes illustrated in FIG. 2B. "The distance between the bottom portions of the two adjacent concave portions through the convex portion" indicates a distance P between the bottom portions of the concave portions illustrated by a reference mark B in FIG. 3B. In addition, "the inner angle on the apex of the triangular convex portion formed by connecting the apex of the convex portion and the bottom portion of the two adjacent concave portions through the convex portion" indicates an inner angle θ on an apex T of a triangular convex portion formed by connecting the apex of the convex portion illustrated by a reference mark T in FIG. 3B and the bottom portion B of the two concave portions.

On the other hand, in a case where the bottom portion of the concave portion is a flat surface, as illustrated in FIG. 3C, a distance between two points at which the bottom surface of the concave portion and the bottom surface of the convex portion intersect with each other is defined as "the distance between the bottom portions of the two adjacent concave portions through the convex portion". In this case, an inner angle θ on the apex T of a triangular convex portion formed by connecting the two points described above and the apex T of the convex portion becomes "the inner angle on the apex of the triangular convex portion formed by connecting the apex of the convex portion and the bottom portion of the two adjacent concave portions through the convex portion".

Furthermore, the sectional surface including the perpendicular line passing through the apex T of the convex portion has a plurality of different shapes. For example, in the tetragonal pyramidal shape illustrated in FIG. 2A, the shape of a sectional surface passing through the apex and the diagonal line of the bottom surface is different from the shape of a sectional surface passing through the apex and a center point of two facing sides, and in the latter, "the distance between the bottom portions of the two adjacent concave portions through the convex portion" becomes the minimum value. Thus, in a case where a plurality of sectional shapes are able to be formed, "the distance between the bottom portions of the two adjacent concave portions through the convex portion" and "the inner angle on the apex of the triangular convex portion formed by connecting the apex of the convex portion and the bottom portion of the two adjacent concave portions through the convex portion" are defined on the sectional surface in which "the distance between the bottom portions of the two adjacent concave portions through the convex portion" becomes the minimum value.

In the above description, the irregular shape formed of the shapes which are two-dimensionally arranged has been described, and the irregular shape included in the shape of the interface described above may be formed of shapes which are one-dimensionally arranged. Specific examples of such a shape are illustrated in FIGS. 4A and 4B.

Figure 4A:
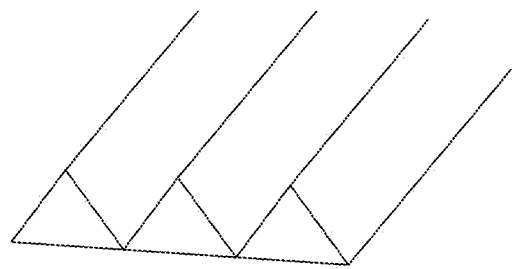
FIGS. 4A and 4B are schematic views illustrating one example of the irregular shape formed on the interface between the two layers which are directly laminated in the wavelength conversion member according to one aspect of the present invention.
Figure 4B:
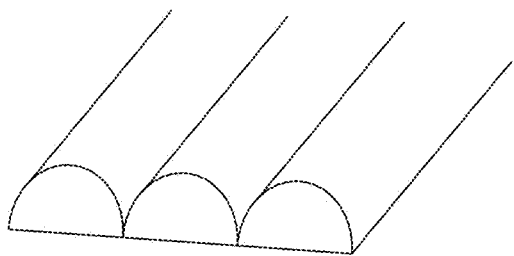

FIGS. 4A and 4B are schematic views of the irregular shape formed of the shapes which are one-dimensionally arranged. FIG. 4A illustrates an irregular shape formed by one-dimensionally arranging a plurality of trigonal pyramidal shapes. FIG. 4B illustrates an irregular shape formed by one-dimensionally arranging a plurality of partially circular columnar shapes. Specific examples of the shapes which are one-dimensionally arranged include a polygonal columnar shape, a partially elliptical columnar shape, and the like other than the trigonal pyramidal shape. Furthermore, the partially circular columnar shape indicates a shape in which a part of a column is cut in a long axis direction, and as illustrated in FIG. 4B, examples of the partially circular columnar shape are able to include a semi-columnar shape in which a columnar is cut in half in the long axis direction. The same applies to the partially elliptical columnar shape. In the shapes which are one-dimensionally arranged, "the distance between the bottom portions of the two adjacent concave portions through the convex portion" and "the inner angle on the apex of the triangular convex portion formed by connecting the apex of the convex portion and the bottom portion of the two adjacent concave portions through the convex portion" are able to be determined as described above.

In both of the irregular shape formed by two-dimensionally arranging the shapes described above or the irregular shape formed by one-dimensionally arranging the shapes described above, it is preferable that the sectional shape of the convex portion is a triangular shape from the viewpoint of further improving the light emitting efficiency of the quantum dot and the exiting efficiency from the wavelength conversion member.

The irregular shape described above may exist on at least a part of the interface between the two layers which are directly laminated, or may not exist on the entire interface. In a case where the irregular shape exists on a part of the interface, an aspect is preferable in which the irregular shape exists on the center portion but does not exist on the outer circumferential portion surrounding the center portion from the viewpoint of an exiting efficiency. In addition, it is preferable that the irregular shape exists on the entire interface from the viewpoint of further improving the light emitting efficiency of the quantum dot and the exiting efficiency from the wavelength conversion member.

Figure 5A:
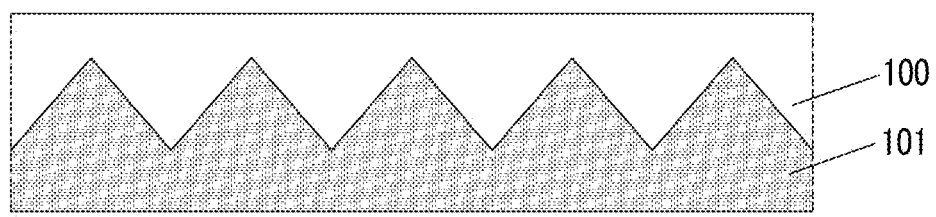
FIGS. 5A to 5C are schematic views illustrating one example of a partial sectional surface of the two layers which are directly laminated in the wavelength conversion member according to one aspect of the present invention.
Figure 5B:
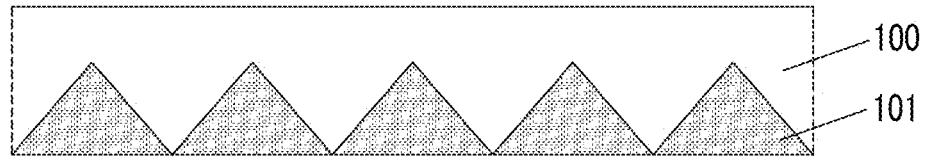
Figure 5C:
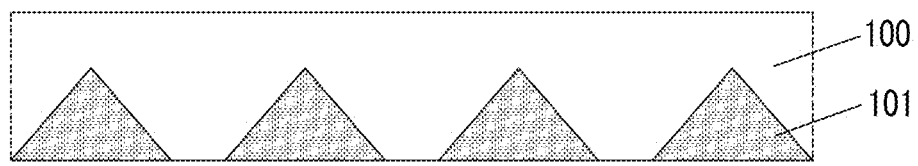

In addition, FIGS. 5A to 5C are schematic views illustrating one example of the partial sectional surface of the two layers which are directly laminated. In the wavelength conversion member described above, both of the two layers which are directly laminated are continuous layers in one aspect, and one of the two layers which are directly laminated is a discontinuous layer in the other aspect. In FIGS. 5A to 5C, in the example illustrated in FIG. 5A, both layers (a layer 100 and a layer 101) are a continuous layer. In contrast, in FIGS. 5B and 5C, one (the layer 101) of the two layers which are directly laminated is a discontinuous layer.

The irregular shape described above is able to be formed by a known molding method such as a transfer method and a press method. The irregular shape is formed on the surface of any one of the two layers which are directly laminated, and the other layer is formed on the surface on which the irregular shape is formed, and thus, the irregular shape is able to be formed on the interface. In general, a known technology relevant to manufacturing of a prism sheet is able to be applied to the formation of the irregular shape without any limitation. Alternatively, in one aspect, a commercially available prism sheet (for example, BEF series manufactured by Sumitomo 3M Limited, and the like) are able to be used as one layer of the two layers which are directly laminated. More specifically, the polymerizable composition for forming a wavelength conversion layer is applied onto the surface (an exiting surface) of the commercially available prism sheet on which the irregular shape is formed, and the wavelength conversion layer is formed, and thus, it is possible to form the two layers which are directly laminated and have an irregular shape on the interface. Furthermore, in the wavelength conversion member formed as described above, a surface (a flat surface) which is an incidence surface is disposed on an exiting surface side in a case of being used as the prism sheet.

<Average Refractive Index of Directly Laminated Two Layers>

The two layers which are directly laminated and included in the wavelength conversion member described above may be layers having the same average refractive index, or may be layers having different average refractive indices. Here, in the present invention, an average refractive index of a certain layer indicates the average value of a refractive index in an in-plane direction and a refractive index in a thickness direction. The refractive index in each direction is able to be measured by a known refractive index measurement device. One example of the refractive index measurement device is able to include a multiwavelength ABBE'S REFRACTO-METER DR-M2 manufactured by ATAGO CO., LTD. In addition, the refractive index in the present invention indicates a refractive index with respect to light having a wavelength of 550 nm.

In an aspect in which the average refractive indices of the two layers which are directly laminated are different from each other, in a layer having a high average refractive index a layer of high refractive index) and a layer of low refractive index having an average refractive index lower than that of the layer of high refractive index, the layer of high refractive index may be disposed on the excitation light incidence side, and the layer of low refractive index may be disposed on the exiting side, or the layer of low refractive index may be disposed on the excitation light incidence side, and the layer of high refractive index may be on the exiting side. From the reasons described above, the former arrangement is preferable.

In an aspect in which the layer of high refractive index is disposed on the excitation light incidence side, and the layer of low refractive index is disposed on the exiting side, it is preferable that a difference in the average refractive indices between the two layers increases from the viewpoint of a light condensing efficiency to the exiting side. From this viewpoint, the difference in the average refractive indices between the two layers is preferably greater than or equal to 0.20, is more preferably greater than or equal to 025, is even more preferably greater than or equal to 0.30, is further even more preferably greater than or equal to 0.35, is still even more preferably greater than or equal to 0.40, and is further still even more preferably greater than or equal to 0.45. On one hand, a difference in the average refractive indices between the layer of high refractive index and the layer of low refractive index, for example, is less than or equal to 0.70, and it is preferable that the difference increases from the viewpoint of improving a light condensing efficiency, but the difference is not particularly limited.

On the other hand, in an aspect in which the layer of low refractive index is disposed on the excitation light incidence side, and the layer of high refractive index is disposed on the exiting side, it is preferable that the difference in the average refractive indices between the two layers decreases from the viewpoint of the light condensing efficiency to the exiting side. On the other hand, in this aspect, it is considered that the amount of excitation light which is incident on the wavelength conversion member from the light source of the backlight unit, and then, is reflected, preferably retroreflected on the interface between the two layers, and returns to the backlight side increases as the difference in the average refractive indices between the two layers increases. Accordingly, as described above, it is assumed that it is possible to increase a probability of the excitation light incident on the quantum dot, and it is possible to improve the light emitting efficiency of the quantum dot. In consideration of the former viewpoint, the difference in the average refractive indices in the two layers is preferably less than or equal to 0.70, is more preferably less than or equal to 0.65, and is even more preferably less than or equal to 0.60. On the other hand, in consideration of the latter viewpoint, the difference in the average refractive indices between the layer of high refractive index and the layer of low refractive index is preferably greater than or equal to 0.20, is more preferably greater than or equal to 0.25, is even more preferably greater than or equal to 0.30, is further even more preferably greater than or equal to 0.35, is still even more preferably greater than or equal to 0.40, and is further still even more preferably greater than or equal to 0.45.

In consideration of the above description, in both aspects described above, it is preferable that the difference in the average refractive indices between the layer of high refractive index and the layer of low refractive index is from 0.20 to 0.70.

The average refractive index of the layer of low refractive index is preferably less than 1.60, or is less than or equal to 1.55 or less than 1.55, is more preferably less than or equal to 1.50, and is even more preferably less than or equal to 1.45. As described above, it is preferable that the difference in the average refractive indices between the layer of high refractive index and the layer of low refractive index is large from the viewpoint of improving the light condensing efficiency. Then, it is preferable that the average refractive index of the layer of low refractive index is low since it is possible to increase the difference in the average refractive indices between the layer of low refractive index and the layer of high refractive index. On the other hand, the average refractive index of the layer of low refractive index is preferably greater than or equal to 1.00, and is more preferably greater than or equal to 1.10 from the viewpoint of suppressing interface reflection between the layer of low refractive index and the other layer adjacent to the layer of low refractive index on a surface side opposite to the layer of high refractive index (for example, a polarizer layer described below) or the air.

On the other hand, the average refractive index of the layer of high refractive index is preferably greater than or equal to 1.60, is more preferably greater than or equal to 1.65, is even more preferably greater than or equal to 1.80, and is further even more preferably greater than or equal to 2.00. In addition, the average refractive index of the layer of high refractive index is preferably less than or equal to 2.50, is more preferably less than or equal to 2.20, is even more preferably less than 2.10, and is further more preferably less than or equal to 2.05, from the viewpoint of suppressing the interface reflection between the layer of high refractive index and the other layer adjacent to the layer of high refractive index or the air on a surface opposite to the layer of low refractive index.

Furthermore, in an aspect in which the average refractive indices of the two layers which are directly laminated are identical to each other, the average refractive indices of the two layers may be in the range described above with respect to the layer of high refractive index, or may be in the range described above with respect to the layer of low refractive index.

The average refractive index of each layer is able to be adjusted according to the type of component which is used fir forming the layer. The details of the component for forming a wavelength conversion layer are as described above. On the other hand, in an aspect in which one of the directly laminated two layers is not the wavelength conversion layer (does not contain a quantum dot), such a layer, for example, is able to be formed by using a polymerizable composition containing a polymerizable compound and a polymerization initiator described as the component for forming a wavelength conversion layer. Alternatively, one layer of the directly laminated two layers which is not the wavelength conversion layer may be a resin layer containing a resin as a main component. Here, the main component indicates that a resin is the most dominant component in components configuring a layer. The resin to be contained may be one type or two or more types of resins. The amount of resin in the resin layer, for example, is greater than or equal to 50 mass %, and is preferably greater than or equal to 70 mass %, with respect to the total mass of the resin layer, and the amount of resin in the resin layer, for example, is less than or equal to 99 mass %, or less than or equal to 95 mass %, and may be 100 mass %, with respect to the total mass of the resin layer. Specific examples of the resin layer are able to include a thermoplastic resin layer. Examples of the thermoplastic resin are able to include a polymethyl methacrylate resin (PMMA), a polycarbonate resin, a polystyrene resin, a polymethacryl styrene (MS) resin, an acrylonitrile styrene (AS) resin, a polypropylene resin, polyethylene resin, a polyethylene terephthalate resin, a polyvinyl chloride resin (PVC), cellulose acrylate, cellulose triacetate, cellulose acetate propionate, cellulose diacetate, thermoplastic elastomer, or a copolymer thereof, a cycloolefin polymer, and the like. It is preferable that such a resin layer is a cured layer formed by using a polymerizable composition, and by performing a polymerization treatment (a curing treatment) with respect to the composition, from the viewpoint of easiness of forming the layer. The polymerizable composition may be a photopolymerizable composition which is cured by light irradiation, or may be a thermally polymerizable composition which is cured by heating. From the viewpoint of improving productivity, the photopolymerizable composition is preferable since the curing treatment is able to be finished for a short period of time. The same applies to the polymerizable composition for forming a wavelength conversion layer.

One or both of the two layers which are directly laminated may contain particles for adjusting the average refractive index. The particles are not particularly limited, and may be inorganic particles, or may be organic particles.

Specific examples of the particles described above include inorganic particles such as $ZrO_2$, $TiO_2$, $Al_2O_3$, $In_2O_3$, $ZnO$, $SnO_2$, and $Sb_2O_3$, organic particles such as polymethyl methacrylate particles, cross-linking polymethyl methacrylate particles, acryl-styrene copolymer particles, melamine particles, polycarbonate particles, polystyrene particles, cross-linking polystyrene particles, polyvinyl chloride particles, benzoguanamine-melamine formaldehyde particles, and the like. In addition, particles in which the surface is subjected to a surface treatment, and thus, a coated layer is formed on the surface in order to suppress activation on the surface of the particles or to improve dispersibility in the layer, so-called core-shell particles may be used as the particles described above. Such particles, for example, can be referred to paragraphs 0022 to 0025 of JP2013-251067A. In addition, the particles described above may be organic-inorganic composite particles such as particles including an organic film on the surface of inorganic particles.

Only one type of the particles described above may be used, or two or more types thereof may be used by being mixed. It is possible to improve an extraction efficiency of light transmitted through a layer containing the particles or light internally emitted in the layer as the particles become smaller. On the other hand, it is possible to easily disperse the particles and to homogeneously disperse the particles in the layer as the particles become larger. In consideration of the above viewpoint, the particle size is preferably less than or equal to 100 nm as a primary particle diameter, is more preferably less than or equal to 30 nm, and is even more preferably less than or equal to 25 nm. In addition, the particle size is preferably greater than or equal to 1 nm as the primary particle diameter. The primary particle diameter of the particles described above is a value obtained by performing observation with a scanning-type electron microscope (SEM). A particle content in the layer containing the particles described above may be suitably set such that the average refractive index in the range described above is preferably obtained.

The particles described above are also able to function as scattering particles scattering light, and according to such an action, it is possible to farther improve an extraction efficiency of light from the wavelength conversion member. It is preferable that the particle content increases from the viewpoint of the extraction efficiency. In consideration of the above described viewpoint and physical strength of the layer, the particle content in the layer containing the particles described above is preferably from 10 volume % to 50 volume %, is more preferably from 15 volume % to 50 volume %, and is even more preferably from 20 volume % to 50 volume %, with respect to the total volume of the layer containing the particles.

The refractive index of the particles described above (a refractive index with respect to light having a wavelength of 550 nm) is preferably from 2.00 to 3.00, is more preferably from 2.20 to 3.00, is even more preferably from 2.20 to 2.80, and is further even more preferably from 2.20 to 2.60, from the viewpoint of adjusting the average refractive index. Here, the refractive index of the particles is a value which is measured by the following method. A resin material of which the refractive index is known is doped with particles, and thus, the resin material in which the particles are dispersed is prepared. The prepared resin material is applied onto a silicon substrate or a quartz substrate, and thus, a resin film is formed. The refractive index of the formed resin film is measured by an ellipsometer, and thus, the refractive index of the particles is obtained from the volume fraction of resin material and the particles configuring the resin film. The refractive index of titanium oxide particles used in an example described below is a value obtained by the method described above.

<Other Layers and Support>

The wavelength conversion member described above includes at least the above-described two layers which are directly laminated, and may include a support described below in addition to the two layers. In addition, the above-described two layers which are directly laminated are able to include at least one layer selected from the group consisting of an inorganic layer and an organic layer on one surface or two surfaces opposite to the interface. Examples of the inorganic layer and the organic layer are able to include inorganic layer and an organic layer configuring a barrier film described below. It is preferable that at least one layer selected from the group consisting of the inorganic layer and the organic layer is provided on the surface of the wavelength conversion layer from the viewpoint of maintaining a light emitting efficiency. This is because it is possible to prevent oxygen or moisture from penetrating to the wavelength conversion layer from the surface, and to prevent deterioration of the quantum dot due to oxygen or moisture, according to such a layer. In addition, in one aspect, it is preferable that the inorganic layer or the organic layer is included as a layer which is directly in contact with the surface of the wavelength conversion layer. In addition, in another aspect, the surface of the wavelength conversion layer may be bonded to the inorganic layer or the organic layer through a known adhesive layer. In one aspect, in the wavelength conversion member described above, the entire surface of the wavelength conversion layer may be coated (that is, may be sealed).

(Support)

The wavelength conversion member may include a support in order to improve strength, to easily form a film, and the like. The support may be included as a layer which is adjacent to the wavelength conversion layer or is directly in contact with the wavelength conversion layer, or may be included as a substrate film of the barrier film described below. In the wavelength conversion member, the support may be included in the order of an inorganic layer described below and the support, or may be included in the order of the wavelength conversion layer, the inorganic layer described below, an organic layer described below, and the support. The support may be disposed between the organic layer and the inorganic layer, between two organic layers, or between two inorganic layers. In addition, one or two or more supports may be included in the wavelength conversion member, and the wavelength conversion member may have a structure in which the support, the above-described two layers which are directly laminated, and the support are laminated in this order. A transparent support which is transparent with respect to visible light is preferable as the support. Here, being transparent with respect to the visible light indicates that a light ray transmittance in a visible light range is greater than or equal to 80%, and is preferably greater than or equal to 85%. The light ray transmittance which is used as a scale transparency is able to be calculated by a method disclosed in JIS-K7105, that is, by measuring the total light ray transmittance and the amount of scattering light with an integrating sphere type light ray transmittance measurement device, and by subtracting a diffusion transmittance from the total light ray transmittance. The support can be referred to paragraphs 0046 to 0052 of JP2007-290369A and paragraphs 0040 to 0055 of JP2005-096108A.

The thickness of the support is in a range of 10 to 500 μm from the viewpoint of gas barrier properties, impact resistance, and the like, and among them, is preferably in a range of 20 to 400 μm, and is particularly preferably in a range of 30 to 300 μm.

(Barrier Film)

The wavelength conversion member is able to include a barrier film. The barrier film is a film having a gas barrier function of blocking oxygen. It is preferable that the barrier film has a function of blocking water vapor.

It is preferable that the barrier film is included in the wavelength conversion member as a layer which is adjacent to the wavelength conversion layer or is directly in contact with the wavelength conversion layer. In addition, one or two or more barrier films may be included in the wavelength conversion member, or the wavelength conversion member may have a structure in which the barrier film, the above-described two layers which are directly laminated, and the barrier film are laminated in this order. In the wavelength conversion member, the wavelength conversion layer may be formed by using the barrier film as a substrate.

The barrier film may be any known barrier film, and for example, may be a barrier film described below.

In general, the barrier film may include at least an inorganic layer, and may be a film including the substrate film and the inorganic layer. The substrate film can be referred to the description of the support described above. The barrier film may include a barrier laminate including at least one inorganic layer and at least one organic layer on the substrate film. By laminating a plurality of layers as described above, it is possible to further increase barrier properties, but the light transmittance of the wavelength conversion member tends to decrease as the number of layers to be laminated increases, and thus, it is desirable that the number of layers to be laminated increases in a range where an excellent light transmittance is able to be maintained. Specifically, in the barrier film, it is preferable that the total light ray transmittance in a visible light range is greater than or equal to 80%, and an oxygen permeability is less than or equal to 1 cm$^3$/(m$^2$·day·atm). Here, the oxygen permeability described above is a value measured by using an oxygen gas permeability measurement device (manufactured by MOCON, Inc., OX-TRAN 2/20: Product Name) under conditions of a measurement temperature of 23° C. and relative humidity of 90%. In addition, the visible light range indicates a wavelength range of 380 to 780 nm, and the total light ray transmittance indicates the average value of the light transmittance in the visible light range.

The oxygen permeability of the barrier film is more preferably less than or equal to 0.1 cm$^3$/(m$^2$·day·atm), and is even more preferably less than or equal to 0.01 cm$^3$/(m$^2$·day·atm). The total light ray transmittance in the visible light range is more preferably greater than or equal to 90%. It is preferable that the oxygen permeability becomes lower, and it is preferable that the total light ray transmittance in the visible light range becomes higher.

(Inorganic Layer)

The "inorganic layer" is a layer containing an inorganic material as a main component, and preferably is a layer formed only of an inorganic material. In contrast, the organic layer is a layer containing an organic material as a main component, and preferably is a layer containing an organic material of preferably greater than or equal to 50 mass %, more preferably greater than or equal to 80 mass %, and particularly preferably greater than or equal to 90 mass %.

The inorganic layer can be referred to paragraphs 0043 to 0045 of JP2007-290369A and paragraphs 0064 to 0068 of JP2005-096108A. The film thickness of the inorganic layer is in a range of 10 nm to 500 nm, and among them, is preferably in a range of 10 nm to 300 nm, and is particularly preferably in a range of 10 nm to 150 nm. By setting the film thickness of the inorganic layer to be in the range described above, it is possible to suppress reflection on the barrier film while realizing excellent gas barrier properties, and to suppress the total light ray transmittance from decreasing. In particular, it is preferable that the inorganic layer is a silicon oxide film, a silicon nitride film, or a silicon oxinitride film. This is because such films have excellent adhesiveness with respect to the organic layer, and thus, are able to realize more excellent gas barrier properties.

(Organic Layer)

The organic layer can be referred to paragraphs 0020 to 0042 of JP2007-290369A and paragraphs 0074 to 0105 of JP2005-096108A. Furthermore, it is preferable that the organic layer contains a CARDO polymer. Accordingly, adhesiveness between the organic layer and the adjacent layer, in particular, adhesiveness between the organic layer and the inorganic layer becomes excellent, and thus, more excellent gas barrier properties are able to be realized. The details of the CARDO polymer can be referred to paragraphs 0085 to 0095 of JP2005-096108A. The film thickness of the organic layer is preferably in a range of 0.05 µm to 10 nm, and more preferably in a range of 0.5 to 10 µm. In a case where the organic layer is formed by a wet coating method, the film thickness of the organic layer is in a range of 0.5 to 10 µm, and is preferably in a range of 1 µm to 5 µm. In addition, in a case where the organic layer is formed by a dry coating method, the film thickness of the organic layer is in a range of 0.05 µm to 5 µm, and is preferably in a range of 0.05 µm to 1 µm. This is because it is possible to make the adhesiveness with respect to the inorganic layer more excellent by setting the film thickness of the organic layer which is formed by the wet coating method or the dry coating method to be in the range described above.

The other details of the inorganic layer and the organic layer can be referred to the descriptions of JP2007-290369A, JP2005-096108A, US2012/0113672A1, and JP2013-544018A.

<Outermost Surface of Wavelength Conversion Member>

The wavelength conversion member described above may have the same irregular shape as that of the interface on one or both outermost surfaces, or one or both outermost surfaces may be a flat surface. As described below, in an aspect in which the wavelength conversion member is incorporated as a configuration member of a backlight unit, it is preferable that at least an incidence side outermost surface of the wavelength conversion member described above, which becomes an arrangement surface with respect to the backlight unit, is a flat surface from the viewpoint of easiness of arrangement on the backlight unit. On the other hand, as described below, in an aspect in which the is incorporated as a configuration member of a polarizing plate or a liquid crystal panel, it is preferable that at least an exiting side surface of the wavelength conversion member described above is a flat surface in order to be easily integrally laminated on the surface of the polarizing plate or the liquid crystal panel. Furthermore, the details of being integrally laminated will be described below.

In consideration of the above viewpoint, it is preferable that both of the exiting side outermost surface and the incidence side outermost surface of the wavelength conversion member described above are flat surfaces from the viewpoint of setting the wavelength conversion member to be a member which is able to be easily disposed or laminated on any of the backlight unit, the polarizing plate, and the liquid crystal panel.

In the present invention, the flat surface indicates a surface having a leveling in which arithmetic average roughness Ra of a roughness curve is less than or equal to 0.25 µm. Ra is defined in JIS B 0601, is the average of the absolute value of a height Z at each point in a reference length L, and is denoted by an expression described below.

$$Ra = \frac{1}{L}\int_0^L |Z(x)|dx$$

Examples of a measurement method are able to include a stylus method, an optical method, and the like. Ra is able to be measured by using a non-contact surface-layer sectional shape measurement system VertScan (manufactured by Ryoka Systems Inc.) as one example.

Therefore, the outermost surface being the flat surface indicates that Ra of the outermost surface is less than or equal to 0.25 µm. Ra described above is greater than or equal to 0 µm, and for example, is able to be greater than or equal to 0.01 µm, or is able to be greater than or equal to 0.05 µm.

[Backlight Unit]

A backlight unit according to one aspect of the present invention includes at least the wavelength conversion member described above and a light source. The details of the wavelength conversion member are as described above. In general, the wavelength conversion member is disposed on a liquid crystal panel side surface of the backlight unit without using adhesion, pressure sensitive adhesion, or coating formation, and as described below, may be integrally laminated.

(Light Emission Wavelength of Backlight Unit)

It is preferable that a backlight unit including a multi-wavelength light source is used as the backlight unit from the viewpoint of realizing a high brightness and a high color reproducibility. Examples of preferred one aspect are able to include a backlight unit which emits blue light having a light emission center wavelength in a wavelength range of 430 to 480 nm and a light emission intensity peak of which the half-width is less than or equal to 100 nm, green light having a light emission center wavelength in a wavelength range of 500 to 600 nm and a light emission intensity peak of which the half-width is less than or equal to 100 nm, and red light having a light emission center wavelength in a wavelength range of 600 to 680 nm and a light emission intensity peak of which the half-width is less than or equal to 100 nm.

A wavelength range of blue light emitted from the backlight unit is preferably in a range of 440 to 480 nm, and is more preferably in a range of 440 to 460 nm, from the viewpoint of further improving a brightness and color reproducibility.

From the same viewpoint, a wavelength range of green light emitted from the backlight unit is preferably in a range of 510 to 560 nm, and is more preferably in a range of 510 to 545 nm.

In addition, from the same viewpoint, a wavelength range of red light emitted from the backlight unit is preferably in a range of 600 to 650 nm, and is more preferably in a range of 610 to 640 nm.

In addition, from the same viewpoint, all half-widths of light emission intensities of each of the blue light, the green light, and the red light emitted from the backlight unit is preferably less than or equal to 80 nm, is more preferably less than or equal to 50 μm, is even more preferably less than or equal to 40 nm, and is further even more preferably less than or equal to 30 nm. Among them, it is particularly preferable that the half-width of each light emission intensity of the blue light is less than or equal to 25 μm.

The backlight unit includes at least the light source along with the wavelength conversion member described above. In one aspect, a light source emitting blue light which has a light emission center wavelength in a wavelength range of 430 nm to 480 nm, for example, a blue light emitting diode emitting blue light is able to be used as the light source. In a case where the light source emitting blue light is used, it is preferable that in the wavelength conversion member, at least, the quantum dot A which is excited by excitation light and emits red light and the quantum dot B which emits green light are contained in the same layer or in different layers. Accordingly, white light is able to be realized by the blue light which is emitted from the light source and is transmitted through the wavelength conversion member, and the red light and the green light emitted from the wavelength conversion member.

In addition, in another aspect, a light source emitting ultraviolet light which has a light emission center wavelength in a wavelength range of 300 nm to 430 nm, for example, an ultraviolet light emitting diode is able to be used as the light source. In this case, it is preferable that in the wavelength conversion member, the quantum dot C which is excited by excitation light and emits blue light is contained in the same layer or in different layers, along with the quantum dots A and B. Accordingly, white light is able to be realized by the red light, the green light, and the blue light which are emitted from the wavelength conversion member.

In addition, in another aspect, the light emitting diode is able to be substituted with a laser light source.

(Configuration of Backlight Unit)

The configuration of the backlight unit may be an edge light mode backlight unit including a light guide plate, a reflection plate, and the like as a configuration member, or may be a direct backlight mode backlight unit. In FIGS. 1A and 1B, an example of an edge light mode backlight unit is illustrated as one aspect. A known light guide plate is able to be used as the light guide plate without any limitation.

In addition, the backlight unit is able to include a reflection member in the rear portion of the light source. Such a reflection member is not particularly limited, and known reflection members disclosed in JP3416302B, JP3363565B, JP4091978B, JP3448626B, and the like are able to be used, and the contents of the publications are incorporated in the present invention.

In addition, it is preferable that the backlight unit also includes a known diffusion plate or diffusion sheet, a known prism sheet (for example, BEF series manufactured by Sumitomo 3M Limited, and the like), and a known light guide device. Such other members are disclosed in each of the publications of JP3416302B, JP3363565B, JP4091978B, JP3448626B, and the like, and the contents of the publications are incorporated in the present invention.

In a case where the wavelength conversion member described above is included as the configuration member of the backlight unit, in a liquid crystal display device, the wavelength conversion member is disposed with a space with respect to a liquid crystal panel (through an air layer). On the other hand, the wavelength conversion member may be included as the configuration member of the polarizing plate or the liquid crystal panel. Hereinafter, such an aspect will be described.

[Polarizing Plate]

A polarizing plate according to one aspect of the present invention includes at least the wavelength conversion member described above and a polarizer. The details of the wavelength conversion member are as described above.

In general, a liquid crystal panel includes a visible side polarizing plate, a liquid crystal cell, and a backlight side polarizing plate. The polarizing plate according to one aspect of the present invention is able to be preferably used as the backlight side polarizing plate. More preferably, the wavelength conversion member described above and the polarizer are arranged in this order from the backlight side towards the liquid crystal cell side.

In the polarizing plate described above, preferably, the wavelength conversion member described above is integrally laminated on the surface of the polarizing plate on the backlight side. Here, in the present invention, the wavelength conversion member "being integrally laminated" on the surface of the polarizing plate is used as the meaning excluding a state in which the wavelength conversion member is simply disposed on the polarizing plate without using adhesion, pressure sensitive adhesion, or coating formation. For example, a state in which the surface of the polarizing plate (for example, the surface of the polarizer or the surface of a protective film formed on the surface of the polarizer) adheres onto the surface of the wavelength conversion member by an interlayer bonding two layers, such as an easily adhesive layer and a pressure sensitive adhesive layer, a state in which the surface of the polarizing plate adheres onto the surface of the wavelength conversion member by lamination processing (thermal pressure bonding) without using lamination processing or adhesion using an adhesive, a state in which the wavelength conversion member is formed on the surface of the polarizing plate by coating (more specifically, a composition for forming the wavelength conversion member is applied onto the surface of the polarizing plate, and then, is dried, and as necessary, is subjected to a treatment such as curing, and thus, the wavelength conversion member is formed), and the like are included in "being integrally laminated".

In addition, in a liquid crystal panel described below, the liquid crystal panel and the wavelength conversion member being "integrally laminated" is used as the meaning excluding a state in which the wavelength conversion member is disposed on the liquid crystal panel without using adhesion, pressure sensitive adhesion, or coating formation. An aspect of being integrally laminated is as described above.

The details of the polarizer included in the polarizing plate described above, and a protective film or the like which is able to be arbitrarily included are as described below.

[Liquid Crystal Panel]

A liquid crystal panel according to one aspect of the present invention includes at least the above-described polarizing plate according to one aspect of the present invention and a liquid crystal cell. Preferably, the liquid crystal panel described above includes a visible side polarizing plate, a liquid crystal cell, and a backlight side polarizing plate, and the backlight side polarizing plate includes the above-described polarizing plate according to one aspect of the present invention. In addition, the liquid crystal panel is able to arbitrarily include various layers which are generally included in a liquid crystal panel, such as a protective film and a retardation plate.

<Layer, Member, and Film Capable of Configuring Liquid Crystal Panel>

(Easily Adhesive Layer)

In the liquid crystal panel according to one aspect of the present invention, preferably, the wavelength conversion member is integrally laminated on the surface of the liquid crystal panel. In order to improve adhesiveness between the wavelength conversion member and a member configuring the liquid crystal panel (for example, the surface of the polarizer surface or a protective film formed on the surface of the polarizer), it is preferable that an easily adhesive layer is disposed on the wavelength conversion member. The easily adhesive layer may be one layer, or may be formed by laminating two or more layers. A known easily adhesive layer is able to be used as the easily adhesive layer without any limitation. An easily adhesive layer which is disclosed as an intermediate back coat film in paragraphs 0061 to 0064 of JP2014-069554A is able to be exemplified as one aspect of a preferred easily adhesive layer.

The thickness of the easily adhesive layer is able to be controlled by adjusting a coating amount of a composition for forming the easily adhesive layer (a coating liquid). In order to exhibit a high transparency and an excellent adhesive force, it is preferable that the thickness is in a range of 0.01 to 5 μm. By setting the thickness to be greater than or equal to 0.01 μm, it is possible to more reliably improve an adhesive force, compared to a case where the thickness is less than 0.01 μm. By setting the thickness to be less than or equal to 5 μm, it is possible to form an easily adhesive layer with a more uniform thickness, compared to a case where the thickness is greater than 5 μm. Further, An increase in the use amount of the coating liquid is suppressed, and thus, it is possible to prevent a drying time from being prolonged and to prevent an increase in costs. A more preferred range of the thickness of the easily adhesive layer is 0.02 μm to 3 μm. In addition, the easily adhesive layer may be formed by laminating two or more layers in the thickness range described above.

(Liquid Crystal Cell)

A driving mode of the liquid crystal cell is not particularly limited, and various modes such as a twisted nematic (TN) mode, a super twisted nematic (STN) mode, a vertical alignment (VA) mode, an in-plane switching (IPS) mode, and an optically compensated bend cell (OCB) mode are able to be used.

In general, the liquid crystal cell includes two substrates, and a liquid crystal layer positioned between the two substrates. In general, the substrate is a glass substrate, and may be a plastic substrate or a laminate of glass and plastic. In a case where the substrate is formed only of plastic, a material which rarely has optical anisotropy in the plane, such as polycarbonate (PC) and polyether sulfone (PES), is useful since such material does not inhibit polarization control of the liquid crystal layer. The thickness of one substrate is generally in a range of 50 μm to 2 mm.

In general, the liquid crystal layer of the liquid crystal cell is formed by sealing a space which is formed by interposing a spacer between the two substrates with liquid crystals. In general, a transparent electrode layer is formed on the substrate as a transparent film containing a conductive substance. There is a case in which layers such as a gas barrier layer, a hard coat layer, and an undercoat layer used in adhesion of the transparent electrode layer are disposed in the liquid crystal cell. Such layers, in general, are disposed on the substrate.

(Polarizer)

A polarizer which is generally used in a liquid crystal display device is able to be used as the polarizer included in the visible side polarizing plate and the backlight side polarizing plate without any limitation. For example, a stretching film formed by dipping a polyvinyl alcohol film in an iodine solution and by stretching the polyvinyl alcohol film, or the like is able to be used. The thickness of the polarizer is not particularly limited. It is preferable that the polarizer becomes thinner from the viewpoint of thinning the liquid crystal display device, and it is preferable that the polarizer has a constant thickness in order to maintain the contrast of the polarizing plate. From the above viewpoint, it is preferable that the thickness of the polarizer included in both of the visible side polarizing plate and the backlight side polarizing plate is in a range of 0.5 μm to 80 μm, is more preferably in a range of 0.5 μm to 50 μm, and is even more preferably in a range of 1 μm to 25 μm. In addition, the thicknesses of the polarizers included in the visible side polarizing plate and the backlight side polarizing plate may be identical to each other or different from each other. The details of the polarizer can be referred to paragraphs 0037 to 0046 of JP2012-189818A.

(Protective Film)

In general, the polarizing plate includes a protective film on one or both surfaces of the polarizer. In the liquid crystal panel according to one aspect of the present invention, each of the visible side polarizing plate and the backlight side polarizing plate may include a protective film on one or both surfaces of the polarizer. The thickness of the protective film is able to be suitably set. In general, the thickness of the protective film is approximately 1 to 500 μm, is preferably 1 to 300 μm, is more preferably 5 to 200 μm, and is even more preferably 5 to 150 μm, from the viewpoint of workability such as strength or handling, thinning, and the like. Furthermore, both of the visible side polarizing plate and the backlight side polarizing plate may bond the polarizer to the liquid crystal cell without using the protective film. This is because, the liquid crystal cell, in particular, the substrate of the liquid crystal cell is able to exhibit a barrier function.

A thermoplastic resin having excellent transparency, excellent mechanical strength, excellent heat stability, excellent moisture blocking properties, excellent isotropy, and the like is preferably used as the protective film of the polarizing plate. Specific examples of such a thermoplastic resin include a cellulose resin such as triacetyl cellulose, a polyester resin, a polyether sulfone resin, a polysulfone resin, a polycarbonate resin, a polyamide resin, a polyimide resin, a polyolefin resin, a (meth)acrylic resin, a cyclic polyolefin resin (a norbornene-based resin), a polyarylate resin, a polystyrene resin, a polyvinyl alcohol resin, and a mixture thereof. The details of a resin which is able to be used as the protective film can be referred to paragraphs 0049 to 0054 of JP2012-189818A.

A film including one or more functional layers on a thermoplastic resin film is able to be used as a polarizing plate protective film. Examples of the functional layer include a layer of low moisture permeability, a hard coat layer, an antireflection layer to layer of which the refractive index is adjusted, such as a layer of low refractive index, a layer of intermediate refractive index, and a layer of high refractive index), an antiglare layer, an antistatic layer, an ultraviolet absorption layer, and the like. For example, using the protective film including the layer of low moisture permeability as the polarizing plate protective film is effective from a viewpoint of suppressing the deformation of the polarizer due to a change in humidity. A known technology is able to be applied to such a functional layer without any limitation. The layer thickness of the protective film including the functional layer, for example, is in a range of 5 to 100 μm, is preferably in a range of 10 to 80 μm, and is more preferably in a range of 15 to 75 μm. Furthermore, only the functional layer is able to be laminated on the polarizer without using the thermoplastic resin film.

(Adhesive Layer and Pressure Sensitive Adhesive Layer)

The polarizer and the protective film are able to be bonded to each other by a known adhesive layer or a known pressure sensitive adhesive layer. The details, for example, can be referred to paragraphs 0056 to 0058 of JP2012-189818A and paragraphs 0061 to 0063 of JP2012-133296A. In addition, in the liquid crystal panel, the liquid crystal display device, and the polarizing plate according to one aspect of the present invention, in a case where the layers and the members are bonded to each other, a known adhesive or a known pressure sensitive adhesive layer is able to be used.

(Retardation Layer)

The visible side polarizing plate and the backlight side polarizing plate are able to include at least one retardation layer between the liquid crystal cell and the polarizing plate. For example, the retardation layer may be included as an inner side polarizing plate protective film on the liquid crystal cell side. A known cellulose acrylate film or the like is able to be used as such a retardation layer.

(Touch Panel Substrate and Front Plate)

A touch panel substrate is able to be included in the visible side polarizing plate surface. The liquid crystal display device including the touch panel substrate is able to be used as an input device. In addition, a front plate which is disposed to protect the liquid crystal display device may be disposed on the surface of the visible side polarizing plate.

<Bonding of Wavelength Conversion Member>

In the liquid crystal panel according to one aspect of the present invention, preferably, liquid crystal panel surface, preferably, on the wavelength conversion member is integrally laminated on a backlight side surface. Bonding for integral lamination is able to be performed through an adhesive layer or a pressure sensitive adhesive layer. The details are as described above with respect to the adhesive layer and the pressure sensitive adhesive layer. In addition, as described above, the wavelength conversion member is able to be bonded onto the surface of the liquid crystal panel by lamination processing using an adhesive or lamination processing not using an adhesive (thermal pressure bonding). Alternatively, the wavelength conversion member is able to be formed by being applied onto the backlight side surface of the liquid crystal panel. The same bonding applies to the polarizing plate according to one aspect of the present invention.

[Liquid Crystal Display Device]

The liquid crystal display device according to one aspect of the present invention includes at least the backlight unit according to one aspect of the present invention and a liquid crystal panel. The backlight unit according to one aspect of the present invention includes the wavelength conversion member described above.

The description of the liquid crystal panel included in the liquid crystal display device described above is identical to the description of the above-described liquid crystal panel according to one aspect of the present invention except for not including the wavelength conversion member described above.

A liquid crystal display device according to another aspect of the present invention includes at least the liquid crystal panel according to one aspect of the present invention and a backlight unit including a light source. The liquid crystal panel according to one aspect of the present invention includes the wavelength conversion member described above.

The description of the backlight unit included in the liquid crystal display device described above is identical to the description of the above-described backlight unit according to one aspect of the present invention except for not including the wavelength conversion member described above.

EXAMPLES

Hereinafter, the present invention will be described in more detail on the basis of the following examples. Materials, use amounts, ratios, treatment contents, treatment sequences, and the like of the following examples are able to be suitably changed unless the changes cause deviance from the gist of the present invention. Therefore, the range of the present invention will not be restrictively interpreted by the following specific examples.

1. Preparation of Polymerizable Composition Containing Titanium Oxide Particles (Composition Type 1)

18.2 parts by mass of trimethylol propane triacrylate, 80.8 parts by mass of lauryl methacrylate, and 1 part by mass of a photopolymerization initiator (Irgacure (Registered Trademark) 819 manufactured by BASF SE) were mixed.

Slurry (Solvent: Methyl Ethyl Ketone, Concentration of Titanium Oxide Particles of 30 mass %) in which titanium oxide ($TiO_2$) particles (a primary particle diameter of less than or equal to 100 nm) were dispersed in the mixture described above (hereinafter, also referred to as a binder) was doped, and was sufficiently stirred, and thus, a polymerizable composition containing titanium oxide particles was prepared. The titanium oxide particles described above are titanium oxide particles which are subjected to a surface treatment by aluminum oxide in order to suppress photoactivation of titanium oxide, and the refractive index thereof is 2.40. In order to adjust the average refractive index of each layer described below, the added amount of the titanium oxide particle slurry with respect to the binder was set in the mass scale and in a range of binder:titanium oxide particle slurry=7:3 to 6:4.

2. Preparation of Polymerizable Composition Containing Quantum Dots A and B, and Titanium Oxide Particles (Composition Type 2)

A toluene dispersion liquid of a quantum dot was added to 100 mg of a titanium oxide-containing polymerizable composition prepared by the method disclosed in 1. described above such that each concentration of a quantum dot A having a light emission center wavelength in a wavelength range of 600 to 680 nm and a quantum dot B having a light emission center wavelength in a wavelength range shorter than that of the quantum dot A, such as in a wavelength range of 500 to 600 nm, became 0.1 mass %, and reduced pressure drying was performed for 30 minutes. Stirring was performed until the quantum dots were dispersed, and thus, a polymerizable composition containing the quantum dots A and B, and the titanium oxide particles was obtained.

3. Preparation of Polymerizable Composition Containing Quantum Dot A and Titanium Oxide Particles (Composition Type 3)

A toluene dispersion liquid of a quantum dot was added to 100 mg of a titanium oxide-containing polymerizable composition prepared by the method disclosed in 1. described above such that the concentration of the quantum dot A having a light emission center wavelength in a wavelength range of 600 to 680 nm became 0.1 mass %, and reduced pressure drying was performed for 30 minutes. Stirring was performed until the quantum dots were dispersed, and thus, a polymerizable composition containing the quantum dot A and the titanium oxide particles was obtained.

4. Preparation of Polymerizable Composition Containing Quantum Dot B and TITANIUM Oxide Particles (Composition Type 4)

A toluene dispersion liquid of a quantum dot was added 100 mg of a titanium oxide-containing polymerizable composition prepared by the method disclosed in 1. described above such that the concentration of the quantum dot B having a light emission center wavelength in a wavelength range shorter than that of the quantum dot A, such as a wavelength range of 500 to 600 nm, became 0.1 mass %, and reduced pressure drying was performed for 30 minutes. Stirring was performed until the quantum dots were dispersed, and thus, a polymerizable composition containing the quantum dot B and the titanium oxide particles was obtained.

5. Examples and Comparative Examples of Preparation of Wavelength Conversion Member Example 1

(1) Preparation of Barrier Film

An organic layer and an inorganic layer were sequentially formed on one surface side of a substrate film (Polyethylene Terephthalate Film, Product Name: COSMOSHINE (Registered Trademark) A4300 manufactured by TOYOBO CO., LTD., Thickness of 50 μm) in the following procedure.

Trimethylol propane triacrylate (TMPTA manufactured by DAICEL-ALLNEX LTD.) and a photopolymerization initiator (ESACURE KTO46 manufactured by Lamberti S.p.A.) were prepared, were weighed to have a mass ratio of the former:the latter=95:5, and were dissolved in methyl ethyl ketone, and thus, a coating liquid having a concentration of solid contents of 15% was obtained. The coating liquid was applied onto the PET film described above in a roll-to-roll manner by using a die coater, and passed through a drying zone of 50° C. for 3 minutes. After that the coating liquid was irradiated with an ultraviolet ray (integrated irradiation dose of approximately 600 mJ/cm$^2$) under a nitrogen atmosphere, was cured by ultraviolet curing, and was wound. The thickness of the organic layer formed on the support was 1 μm.

Next, the inorganic layer (a silicon nitride layer) was formed on the surface of the organic layer by using a roll-to-roll type chemical vapor deposition (CVD) device. Silane gas (a flow rate of 160 sccm), ammonia gas (a flow rate of 370 sccm), hydrogen gas (a flow rate of 590 sccm), and nitrogen gas (a flow rate of 240 sccm) were used as raw material gas. High frequency power having a frequency of 13.56 MHz was used as power. A film forming pressure was 40 Pa, and an arrival film thickness was 50 nm. Thus, a barrier film was prepared in which the inorganic layer was laminated on the surface of the organic layer which was formed on the substrate film.

According to the steps described above, two barrier films were prepared in total.

(2) Preparation of Wavelength Conversion Member with Barrier Film

In order to form an irregular shape in which the shapes schematically illustrated in FIG. 2A are two-dimensionally and regularly arranged, an irregular roller having a surface shape which is the inverse shape of a shape to be formed was prepared.

The polymerizable composition (the composition type 2) containing the quantum dots A and B, and the titanium oxide particles prepared in 2, described above was applied onto the surface of one inorganic layer of the two barrier films obtained in (1) described above in conditions of a transport speed of 24 m/minute by a die coating method using a slot die disclosed in Example 1 of JP2006-122889A, and was dried at 60° C. for 60 seconds. After that, the polymerizable composition was cured by being exposed at 5 J/cm$^2$ under a nitrogen atmosphere by using a UV exposure machine (EXECURE 3000W manufactured by HOYA CANDEO OPTRONICS CORPORATION) while pressing the irregular roller described above, and then, was peeled off from the irregular roller, and thus, a wavelength conversion layer (a cured layer) having the irregular shape illustrated in FIG. 2A on the surface was prepared.

Next, the polymerizable composition containing the titanium oxide particles (the composition type 1) prepared in 1. described above was applied onto on the surface of the cured layer described above having the irregular shape under a nitrogen atmosphere by using a bar coder such that irregularity was filled, and then, the other barrier film obtained in (1) described above was superimposed thereon such that the surface of the inorganic layer was positioned on the side of the polymerizable composition containing the titanium oxide particles. After that, the polymerizable composition was cured by being exposed at an ultraviolet ray irradiation dose of 5 J/cm$^2$ under a nitrogen atmosphere by using a UV exposure machine (EXECURE 3000W manufactured by HOYA CANDEO OPTRONICS CORPORATION), and thus, a wavelength conversion member including the wavelength conversion layer and a cured layer (an adjacent layer) containing titanium oxide particles as a layer laminated on the wavelength conversion layer between the two barrier films was obtained.

A part of the wavelength conversion member obtained as described above was cut out by a microtome, and thus, a sample for observing a sectional surface was obtained. In the obtained sample, the irregular shape of the interface between the wavelength conversion layer and the adjacent layer was observed by an optical microscope (ECLIPSE LV100POL manufactured by NIKON CORPORATION), and thus, it was confirmed that a tetragonal pyramidal shape as illustrated in FIG. 2A was formed, θ illustrated in FIG. 3A was 70°, and P was 20 μm. Furthermore, the observation of the shape and the measurement of θ and P are not limited to the optical microscope, and are able to be performed by observation using various microscopes (for example, observation using a scanning-type electron microscope (SEM)) or the like.

In addition, according to the observation of the sectional surface using the optical microscope described above, it was confirmed that the total thickness of two layers of the wavelength conversion layer and the adjacent layer was 50 μm.

(3) Measurement of Refractive Indices of Wavelength Conversion Layer and Adjacent Layer, and Calculation of Average Refractive Index A sample 1 in which a cured layer was formed on a glass substrate in the same composition, the same coating conditions, and the same curing conditions as those of the wavelength conversion layer included in the wavelength conversion member prepared in Example 1, and a sample 2 in which a cured layer was formed on a glass substrate in the same composition, the same coating conditions, and the same curing conditions as those of the adjacent layer included in the wavelength conversion member prepared in Example 1 were prepared.

By using each of the samples, the refractive indices of the cured layer on the glass substrate with respect to light having a wavelength 550 nm in an in-plane direction and a thickness direction were measured by a multiwavelength ABBE'S REFRACTOMETER DR-M2 manufactured by ATAGO CO., LTD., and the average value was obtained. In Table 1, the average refractive index of the cured layer of the sample 1 is shown as the refractive index of the wavelength conversion layer included in the wavelength conversion member prepared in Example 1, and the average refractive index of the cured layer of the sample 2 is shown as the average refractive index of the adjacent layer included in the wavelength conversion layer prepared in Example 1.

(4) Preparation of Backlight Unit and Liquid Crystal Display Device

A backlight unit having the configuration illustrated in FIG. 1A was prepared by using the prepared wavelength conversion member. The wavelength conversion member was disposed on the backlight unit such that the wavelength conversion layer was disposed on an excitation light incidence side, and the adjacent layer was disposed on an exiting side.

A commercially available liquid crystal display device (Product Name of TH-L42D2 manufactured by Panasonic Corporation) was disassembled, and a backlight unit was changed to the backlight unit described above, and thus, a liquid crystal display device was prepared.

(5) Evaluation of Front Brightness

In a state where the liquid crystal display device prepared described above was set to a white display, light emission intensities of red light and green light, and an excitation light intensity of blue light were measured from the front display surface by using a spectroradiometer SR-3 (manufactured by TOPCON CORPORATION).

It is indicated that the red light, the green light, and the blue light having a high intensity exit from wavelength conversion member to the display side as the light emission intensities of the red light and the green light, and the excitation light intensity of the blue light measured from the front surface of the display by the method described above become larger, and thus, a high front brightness is realized. The measurement results are shown as a relative value in Table 1.

Examples 2, and 5 to 9

A wavelength conversion member, a backlight unit, and a liquid crystal display device were prepared and evaluated by the same method as that in Example 1 except that composition types shown in Table 1 were used as a composition for forming a layer disposed on the incidence side and a composition for forming a layer disposed on the exiting side in the backlight unit. The average refractive index of each layer was adjusted according to the added amount of the titanium oxide particle slurry with respect to the binder. The outline and the measurement result of the front brightness of each example are shown in Table 1. Furthermore, as shown in FIGS. 6A-6M, the quantum dot A (emitting red light) was schematically shown as a white circle, and the quantum dot B (emitting green light) was schematically shown as a black circle.

Example 3

In order to form an irregular shape in which the shapes schematically illustrated in FIG. 2B are two-dimensionally and regularly arranged by changing the irregular roller for forming an irregular shape on the surface of the wavelength conversion layer, an irregular roller having a surface shape which is the inverse shape of a shape to be formed was prepared.

A wavelength conversion member, a backlight unit, and a liquid crystal display device were prepared and evaluated by the same method as that in Example 1 except that the irregular roller prepared as described above was used.

A sample for observing a sectional surface was cut out as in Example 1, and the irregular shape of the interface between the wavelength conversion layer and the adjacent layer was observed as in Example 1 by using the sample, and thus, it was confirmed that a half-rotating ellipsoidal shape as illustrated in FIG. 2B was formed, θ illustrated in FIG. 3B was 60°, and P was 20 µm.

In addition, according to the observation of the sectional surface using the optical microscope described above, it was confirmed that the total thickness of two layers of the wavelength conversion layer and the adjacent layer was 50 µm.

The outline and the measurement result of the front brightness of this example are shown in Table 1.

Example 4

A wavelength conversion member, a backlight unit, and a liquid crystal display device were prepared and evaluation by the same method as that in Example 3 except that composition types shown in Table 1 were used as a composition for forming a layer disposed on the incidence side and a composition for forming a layer disposed on the exiting side in the backlight unit. The average refractive index of each layer was adjusted according to the added amount of the titanium oxide particle slurry with respect to the binder. The outline and the measurement result of the front brightness of this example are shown in Table 1.

Comparative Example 1

A wavelength conversion layer was formed on the surface of the inorganic layer of the harrier film in the same conditions as the coating conditions and the curing conditions for forming the layer disposed on the exiting side in the backlight unit in Example 2 by using a composition which was used as the composition for forming the layer disposed on the exiting side in the backlight unit in Example 2, and thus, a wavelength conversion layer having a thickness of 50 m was obtained.

Except for the points described above, a wavelength conversion member, a backlight unit, and a liquid crystal display device were prepared and evaluated by the same method as that in Example 1.

The outline and the measurement result of the front brightness of this comparative example are shown in Table 1.

Comparative Example 2

A wavelength conversion layer was formed on the surface of the inorganic layer of the harrier film in the same conditions as the coating conditions and the curing conditions for forming the layer disposed on the incidence side in the backlight unit in Example 1 by using a composition which was used as the composition for forming the layer disposed on the incidence side in the backlight unit in Example 1, and thus, a wavelength conversion layer having a thickness of 50 μm was obtained.

Except for the points described above, a wavelength conversion member, a backlight unit, and a liquid crystal display device were prepared and evaluated by the same method as that in Example 1.

The outline and the measurement result of the front brightness of this comparative example are shown in Table 1.

Comparative Example 3

A wavelength conversion member, a backlight unit, and a liquid crystal display device were prepared and evaluated by the same method as that in Example 2 except that the formation of the irregularity was not performed with respect to the surface of the cured layer which was formed on the surface of the inorganic layer of the barrier film.

The outline and the measurement result of the front brightness of this comparative example are shown in Table 1.

Example 10

(1) Preparation of Wavelength Conversion Member with Barrier Film

A wavelength conversion member with a barrier film was prepared by the same method as that in Example 1.

(2) Preparation of Polarizing Plate

According to Example 1 of JP2001-141926A, iodine was adsorbed on a stretching polyvinyl alcohol film, and thus, a polarizer having a film thickness of 20 μm was prepared.

A retardation film (TD80UL manufactured by Fujifilm Corporation) was bonded onto one surface of the prepared polarizer through a pressure sensitive adhesive.

A protective film prepared by the following method was subjected to a corona treatment and was bonded onto the other surface of the polarizer, and thus, a polarizing plate was obtained.

<Preparation of Protective Film>

A pellet of a mixture (Tg of 127° C.) of 90 parts by mass of a (meth)acrylic resin having a lactone ring structure described below:

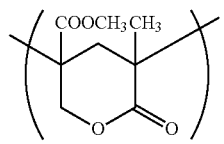

{a copolymerization monomer mass ratio=methyl methacrylate/methyl 2-(hydroxy methyl) acrylate=8/2, a lactone ring formation rate of approximately 100%, a content ratio of a lactone ring structure of 19.4%, a weight-average molecular weight of 133000, a melt flow rate of 6.5 g/10 minutes (240° C., 98.0655 N (10 kgf)), a glass transition temperature Tg of 131° C.} and 10 parts by mass of an acrylonitrile-styrene (AS) resin {TOYO AS AS20, manufactured by TOYO STYRENE Co., Ltd.} was supplied to a biaxial extruder, and was subjected to melting-extrusion into the shape of a sheet at a temperature of approximately 280° C., and thus, a (meth)acrylic resin sheet having a lactone ring structure was obtained. The un-stretched sheet was vertically and horizontally stretched under temperature conditions of 160° C., and thus, a protective film (a thermoplastic resin film) was obtained.

(3) Preparation of Liquid Crystal Panel

Two polarizing plates prepared in (2) described above were bonded to a VA liquid crystal cell (a liquid crystal layer was interposed between two glass substrates having a thickness of 0.42 mm) in crossed nicols arrangement as the visible side polarizing plate and the backlight side polarizing plate by a pressure sensitive adhesive such that retardation film was disposed on the liquid crystal cell side and the protective film was disposed on the outside.

An easily adhesive layer was prepared on the outermost surface of the adjacent layer barrier film (the surface of the substrate film) of the wavelength conversion member prepared in (1) described above.

The easily adhesive layer of the wavelength conversion member was bonded onto the surface of the backlight side polarizing plate (the surface of the protective film) of the liquid crystal panel prepared by the method described above by an acrylic, pressure sensitive adhesive, and thus, a liquid crystal panel including a polarizing plate with a wavelength conversion member was obtained. In the wavelength conversion member incorporated in the obtained liquid crystal panel, the barrier film, the wavelength conversion layer, the adjacent layer, and the barrier film are arranged in this order from the backlight side (the incidence side) towards the exiting side (the liquid crystal cell side).

(4) Mounting on Liquid Crystal Display Device

A commercially available liquid crystal display device (Product Name of TH-L42D2 manufactured by Panasonic Corporation) was disassembled, a prism sheet and a diffusion sheet were taken out, and then, a filter transmitting blue light was disposed between an LED module and a light guide plate which were attached to a reflection plate. Therefore, blue light exited from a backlight unit, and was incident on a liquid crystal panel.

The liquid crystal panel was changed to the liquid crystal panel prepared in (3) described above, and then, the commercially available liquid crystal display device was assembled again, and thus, a liquid crystal display device was obtained.

In the liquid crystal display device of Example 10 prepared as described above, a front brightness was evaluated by the same method as that in Example 1.

The outline and the measurement result of the front brightness of this example are shown in Table 1.

In the wavelength conversion members prepared in the examples and the comparative examples described above, Ra of both outermost surfaces was measured by using a non-contact surface • layer sectional shape measurement system VertScan. (manufactured by Ryoka Systems Inc.), and in all of the examples and the comparative examples, Ra was in a range of 0.08 to 0.10 μm.

From the results described above, it was confirmed that in the wavelength conversion members prepared in the examples and the comparative examples, both of the outermost surfaces were flat surfaces having Ra of less than or equal to 0.25 μm.

In Comparative Example 3, Ra of the surface of the cured layer which was formed on the surface of the inorganic layer of the barrier film was measured before the wavelength conversion layer was formed thereon, and it was confirmed that Ra was in a range of 0.08 to 0.10 μm.

TABLE 1

Figure 6A:
FIGS. 6A to 6M are schematic views illustrating the various configurations of the Examples in Table 1.
Figure 6B:
Figure 6C:
Figure 6D:
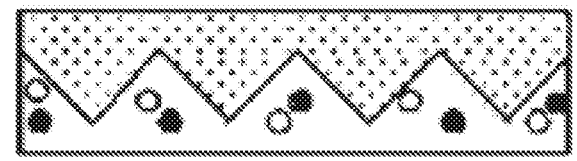
Figure 6E:
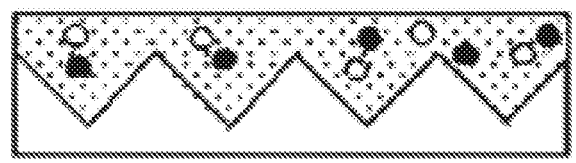
Figure 6F:
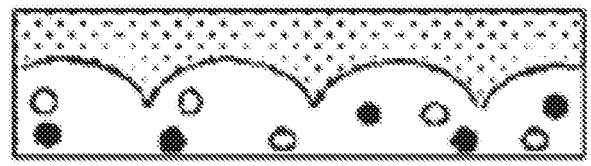
Figure 6G:
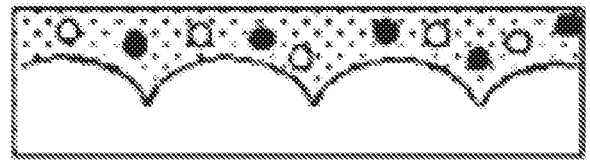

|  |  | Comparative Example 1 | Comparative Example 2 | Comparative Example 3 | Example 1 | Example 2 | Example 3 | Example 4 |
|---|---|---|---|---|---|---|---|---|
| Configuration | Configuration Schematic View | FIG. 6A | FIG. 6B | FIG. 6C | FIG. 6D | FIG. 6E | FIG. 6F | FIG. 6G |
|  | Average Refractive Index of Layer of Low Refractive Index | 1.45 (Prepared by Composition Type 2) | (None) | 1.45 (Prepared by Composition Type 2) | 1.45 (Prepared by Composition Type 1) | 1.45 (Prepared by Composition Type 2) | 1.45 (Prepared by Composition Type 1) | 1.45 (Prepared by Composition Type 2) |
|  | Average Refractive Index of Layer of High Refractive Index | (None) | 1.80 | 1.80 (Prepared by Composition Type 1) | 1.80 (Prepared by Composition Type 2) | 1.80 (Prepared by Composition Type 1) | 1.80 (Prepared by Composition Type 2) | 1.80 (Prepared by Composition Type 1) |
|  | Shape of Interface | (None) | (None) | Flat Surface | Tetragonal Pyramidal Shape (Sectional Surface: Triangular Shape) | Tetragonal Pyramidal Shape (Sectional Surface: Triangular Shape) | Half-Rotating Ellipsoidal Shape (Sectional Surface: Semicircular Shape) | Half-Rotating Ellipsoidal Shape (Sectional Surface: Semicircular Shape) |
|  | Layer Containing Quantum Dot | Layer of Low Refractive Index | Layer of High Refractive Index | Layer of Low Refractive Index | Layer of High Refractive Index | Layer of Low Refractive Index | Layer of High Refractive Index | Layer of Low Refractive Index |
| Evaluation Result of Front Brightness | Light Emission Intensity (Green Light) (a.u) | 1.2 | 1.0 | 1.4 | 2.2 | 1.9 | 1.7 | 1.6 |
|  | Light Emission Intensity (Red Light) (a.u) | 0.6 | 0.5 | 0.7 | 1.1 | 1.0 | 0.9 | 0.8 |
|  | Excitation Light Intensity (Blue Light) (a.u) | 5.2 | 4.9 | 5.0 | 7.2 | 7.2 | 6.5 | 6.4 |

Figure 6H:
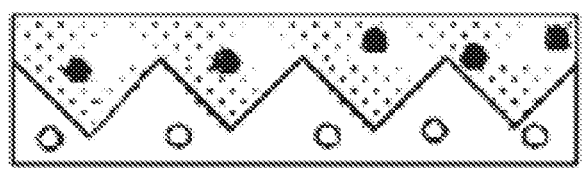
Figure 6I:
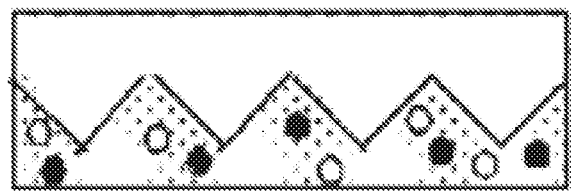
Figure 6J:
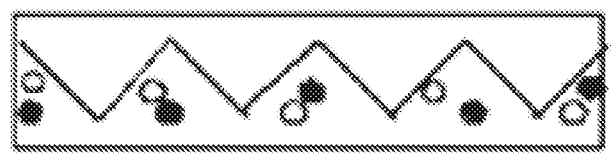
Figure 6K:
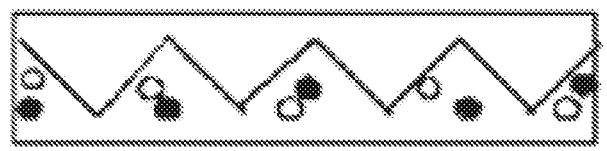
Figure 6L:
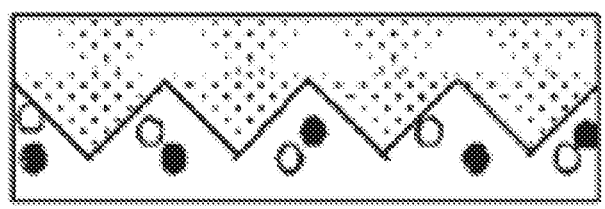
Figure 6M:
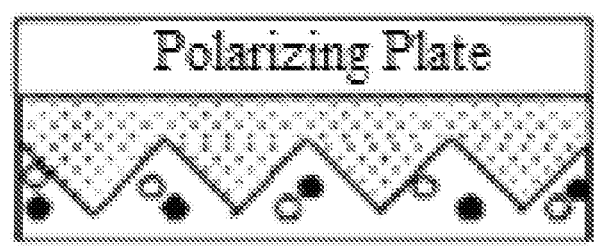

|  |  | Example 5 | Example 6 | Example 7 | Example 8 | Example 9 | Example 10 |
|---|---|---|---|---|---|---|---|
| Configuration | Configuration Schematic View | FIG. 6H | FIG. 6I | FIG. 6J | FIG. 6K | FIG. 6L | FIG. 6M |
|  | Average Refractive Index of Layer of Low Refractive Index | 1.45 (Prepared by Composition Type 4) | 1.45 (Incidence Side, Prepared by Composition Type 1) | 1.55 (Prepared by Composition Type 1) | 1.45 (Prepared by Composition Type 1) | 1.40 (Prepared by Composition Type 1) | 1.45 (Prepared by Composition Type 1) |
|  | Average Refractive Index of Layer of High Refractive Index | 1.80 (Prepared by Composition Type 3) | 1.80 (Exiting Side, Prepared by Composition Type 2) | 1.75 (Prepared by Composition Type 2) | 1.65 (Prepared by Composition Type 2) | 2.00 (Prepared by Composition Type 2) | 1.80 (Prepared by Composition Type 2) |
|  | Shape of Interface | Tetragonal Pyramidal Shape (Sectional Surface: Triangular Shape) | Tetragonal Pyramidal Shape (Sectional Surface: Triangular Shape) | Tetragonal Pyramidal Shape (Sectional Surface: Triangular Shape) | Tetragonal Pyramidal Shape (Sectional Surface: Triangular Shape) | Tetragonal Pyramidal Shape (Sectional Surface: Triangular Shape) | Tetragonal Pyramidal Shape (Sectional Surface: Triangular Shape) |
|  | Layer Containing Quantum Dot | Layer of High Refractive Index and Layer of Low Refractive Index | Layer of High Refractive Index | Layer of High Refractive Index | Layer of High Refractive Index | Layer of High Refractive Index | Layer of High Refractive Index |

TABLE 1-continued

| | | | | | | | |
|---|---|---|---|---|---|---|---|
| Evaluation Result of Front Brightness | Light Emission Intensity (Green Light) (a.u) | 2.3 | 1.3 | 1.5 | 1.6 | 2.3 | 2.5 |
| | Light Emission Intensity (Red Light) (a.u) | 1.3 | 0.7 | 0.8 | 0.9 | 1.3 | 1.2 |
| | Excitation Light Intensity (Blue Light) (a.u) | 7.3 | 5.4 | 6.0 | 6.1 | 8.0 | 7.8 |

(a.u: Arbitrary Unit)

From the results shown in Table 1, it is possible to confirm that in the liquid crystal display devices prepared in the examples, red light and green light according to internal light emission, and blue light (excitation light) from the light source of the backlight unit in the wavelength conversion layer of the wavelength conversion member exit from the wavelength conversion member in a front direction of the display surface with high intensity, and thus, a high front brightness is obtained.

Among the examples, in Examples 1 to 5 and 7 to 10, the layer of high refractive index and the layer of low refractive index were arranged in this order from the excitation light incidence side towards the exiting side. On the other hand, in Example 6, the layer of low refractive index and the layer of high refractive index were arranged in this order from the excitation light incidence side towards the exiting side. From a comparison of the examples, it is possible to confirm that the layer of high refractive index and the layer of low refractive index are arranged in this order from the excitation light incidence side towards the exiting side, and thus, a higher front brightness is obtained.

Further, from a comparison between Example 1 and Example 2 and a comparison between Example 3 and Example 4, it is possible to confirm that in the red light and the green light according to internal light emission in the wavelength conversion layer, a layer on the excitation light incidence side of two layers which are directly laminated through the irregular shape contains a quantum dot, and thus, light having a higher intensity is obtained in the front direction of the display surface.

In addition, from a comparison between Example 1 and Example 3 and a comparison between Example 2 and Example 4, it is possible to confirm that in the irregular shape of the interface between the two layers, the sectional shape of the convex portion is a triangular shape, and thus, blue light, red light, and green light having a higher intensity are obtained in the front direction of the display surface, compared to a case where the sectional shape of the convex portion is a semicircular shape.

INDUSTRIAL APPLICABILITY

The present invention is useful in the manufacturing field of a liquid crystal display device.

What is claimed is:

1. A backlight unit, comprising:
a wavelength conversion member, comprising:
a wavelength conversion layer containing a quantum dot which is excited by excitation light and emits fluorescent light;
an adjacent layer directly laminated on the wavelength conversion layer,
wherein the shape of an interface between the wavelength conversion layer and the adjacent layer includes an irregular shape formed of a concave portion and a convex portion,
wherein the wavelength conversion layer is a layer of low refractive index having an average refractive index lower than that of a layer of high refractive index; the adjacent layer is the layer of high refractive index having an average refractive index higher than the layer of low refractive index and is positioned on an excitation light incidence side from the layer of low refractive index, and
wherein a distance between bottom portions of two adjacent concave portions through the convex portion is in a range of 5 μm to 100 μm; and
a light source.

2. A liquid crystal display device, comprising:
the backlight unit according to claim 1; and
a liquid crystal panel.

3. A polarizing plate, comprising:
the wavelength conversion member according to claim 1; and
a polarizer.

4. A liquid crystal panel, comprising:
the polarizing plate according to claim 3; and
a liquid crystal cell.

5. A liquid crystal display device, comprising:
the liquid crystal panel according to claim 4; and
a backlight unit including a light source.

6. The wavelength conversion member according to claim 1, wherein the average refractive index of the layer of low refractive index is greater than or equal to 1.00 and less than 1.60.

7. The wavelength conversion member according to claim 1, wherein the average refractive index of the layer of high refractive index is from 1.60 to 2.50.

8. The wavelength conversion member according to claim 1, wherein a difference in the average refractive indices between the layer of high refractive index and the layer of low refractive index is from 0.20 to 0.70.

9. The wavelength conversion member according to claim 1, wherein the adjacent layer is a layer containing a quantum dot which is excited by excitation light and emits fluorescent light, and a light emission center wavelength of the quantum dot is different from a light emission center wavelength of the quantum dot contained in the wavelength conversion layer.

10. The wavelength conversion member according to claim 1,
wherein the irregular shape is formed by one-dimensionally or two-dimensionally arranging shapes selected from the group consisting of a polygonal pyramidal shape, a conical shape, a partially rotating ellipsoidal shape, and a partially spherical shape on the interface.

11. The wavelength conversion member according to claim 1,
wherein in the irregular shape, a sectional shape of the convex portion is a triangular shape.

* * * * *